(12) United States Patent
Lo et al.

(10) Patent No.: US 9,647,029 B2
(45) Date of Patent: May 9, 2017

(54) LIGHT-EMITTING DEVICE AND MANUFACTURING METHOD OF A DISPLAY

(71) Applicant: Industrial Technology Research Institute, Hsinchu (TW)

(72) Inventors: Wei-Chung Lo, Taipei (TW); Yu-Wei Huang, Chiayi (TW); Tao-Chih Chang, Taoyuan (TW); Chih-Ming Shen, New Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 14/979,533

(22) Filed: Dec. 28, 2015

(65) Prior Publication Data

US 2017/0104027 A1    Apr. 13, 2017

(30) Foreign Application Priority Data

Oct. 12, 2015 (TW) .............. 104133337 A

(51) Int. Cl.
*H01L 21/00* (2006.01)
*H01L 27/15* (2006.01)
(Continued)

(52) U.S. Cl.
CPC .......... *H01L 27/156* (2013.01); *H01L 33/005* (2013.01); *H01L 33/38* (2013.01);
(Continued)

(58) Field of Classification Search
None
See application file for complete search history.

(56) References Cited

U.S. PATENT DOCUMENTS 6,687,987 B2    2/2004  Mayer et al.
6,864,570 B2    3/2005  Smith
(Continued)

FOREIGN PATENT DOCUMENTS

CN    102142513    8/2011
TW    200701503    1/2007
(Continued)

OTHER PUBLICATIONS

Yu-Wei Huang et al, "Semiconductor Light-Emitting Device and Fabricating Method Thereof", Unpublished Taiwan application No. 104120507, Filed on Jun. 25, 2015.

*Primary Examiner* — Evren Seven
(74) *Attorney, Agent, or Firm* — Jianq Chyun IP Office

(57) ABSTRACT

In an embodiment, a light emitting device comprises a light emitting diode chip and a spherical extending electrode. The light emitting diode chip includes a semiconductor epitaxial structure, a first electrode and a second electrode. The first electrode and the second electrode are disposed on two opposite sides of the semiconductor epitaxial structure, respectively. The first electrode is disposed between the semiconductor epitaxial structure and the spherical extending electrode, and the spherical extending electrode is electrically connected to the semiconductor epitaxial structure electrically through the first electrode. The volume of the spherical extending electrode is greater than that of the light emitting diode chip.

13 Claims, 19 Drawing Sheets

(51) Int. Cl.
*H01L 33/38* (2010.01)
*H01L 33/00* (2010.01)
*H01L 33/62* (2010.01)

(52) U.S. Cl.
CPC ...... *H01L 33/62* (2013.01); *H01L 2933/0016* (2013.01); *H01L 2933/0066* (2013.01)

(56) References Cited

U.S. PATENT DOCUMENTS

| | | | |
|---|---|---|---|
| 7,774,929 B2 | 8/2010 | Jacobs | |
| 7,943,052 B2 | 5/2011 | Wu et al. | |
| 8,609,454 B2 | 12/2013 | Dai et al. | |
| 8,637,892 B2 | 1/2014 | Egoshi et al. | |
| 8,785,953 B2 | 7/2014 | Kim et al. | |
| 2004/0238833 A1* | 12/2004 | Nakata | H01L 25/0753 257/88 |
| 2005/0017344 A1* | 1/2005 | Utsunomiya | H01L 23/48 257/700 |
| 2005/0062153 A1* | 3/2005 | Saito | H01L 23/49816 257/737 |
| 2005/0067622 A1* | 3/2005 | Nakata | H01L 25/041 257/79 |
| 2005/0121683 A1* | 6/2005 | Nakata | H01L 25/0753 257/99 |
| 2005/0127379 A1* | 6/2005 | Nakata | B32B 17/10036 257/84 |
| 2006/0043390 A1* | 3/2006 | Nakata | H01L 31/035281 257/82 |
| 2006/0060983 A1* | 3/2006 | Saito | H01L 21/563 257/780 |
| 2006/0086384 A1* | 4/2006 | Nakata | H01L 25/0753 136/250 |
| 2006/0133073 A1* | 6/2006 | Nakata | H01L 25/167 362/192 |
| 2006/0169992 A1* | 8/2006 | Nakata | H01L 25/0753 257/82 |
| 2007/0090388 A1* | 4/2007 | Wang | H01L 24/03 257/103 |
| 2007/0169804 A1* | 7/2007 | Nakata | H01L 31/035281 136/250 |
| 2008/0106170 A1* | 5/2008 | Knowles | H02N 2/108 310/328 |
| 2009/0108285 A1* | 4/2009 | Nakata | H01L 31/035281 257/103 |
| 2009/0173959 A1* | 7/2009 | Nakata | H01L 31/035281 257/98 |
| 2010/0148198 A1* | 6/2010 | Sugizaki | H01L 33/44 257/98 |
| 2011/0186902 A1 | 8/2011 | Egoshi et al. | |
| 2012/0049223 A1* | 3/2012 | Yang | H01L 33/38 257/98 |
| 2013/0145588 A1* | 6/2013 | Nakata | D03D 1/0076 29/25.01 |
| 2016/0163663 A1* | 6/2016 | Kim | H01L 24/05 257/737 |
| 2016/0336486 A1* | 11/2016 | Lin | H01L 33/005 |

FOREIGN PATENT DOCUMENTS

| | | |
|---|---|---|
| TW | I281717 | 5/2007 |
| TW | 200723556 | 6/2007 |
| TW | 200802934 | 1/2008 |
| TW | I336964 | 2/2011 |
| TW | 201340367 | 10/2013 |

\* cited by examiner

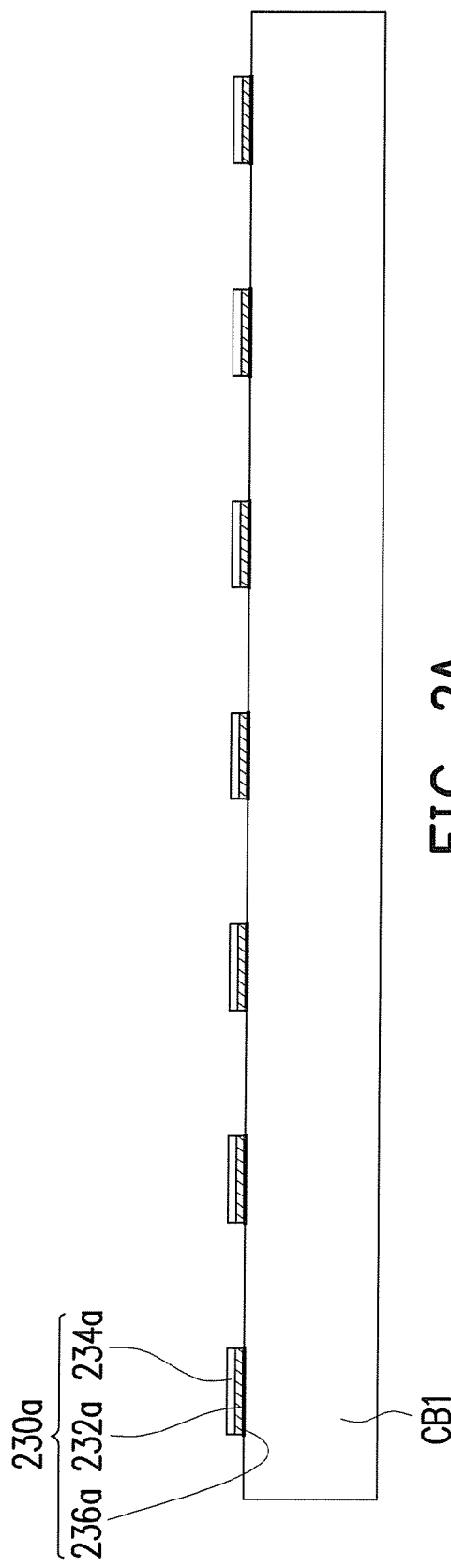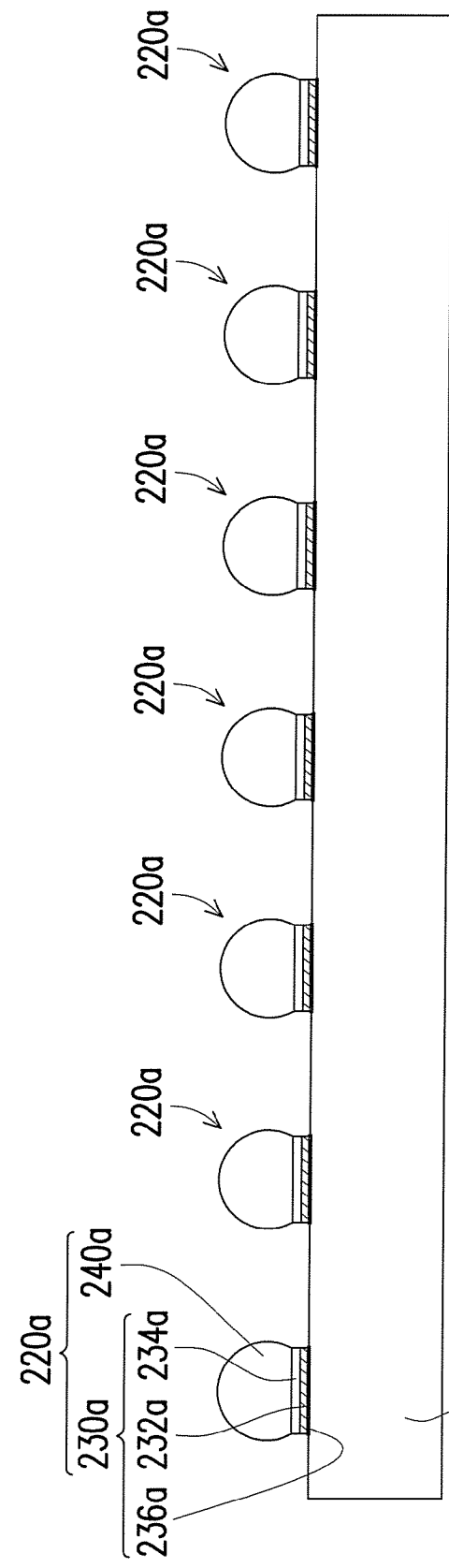

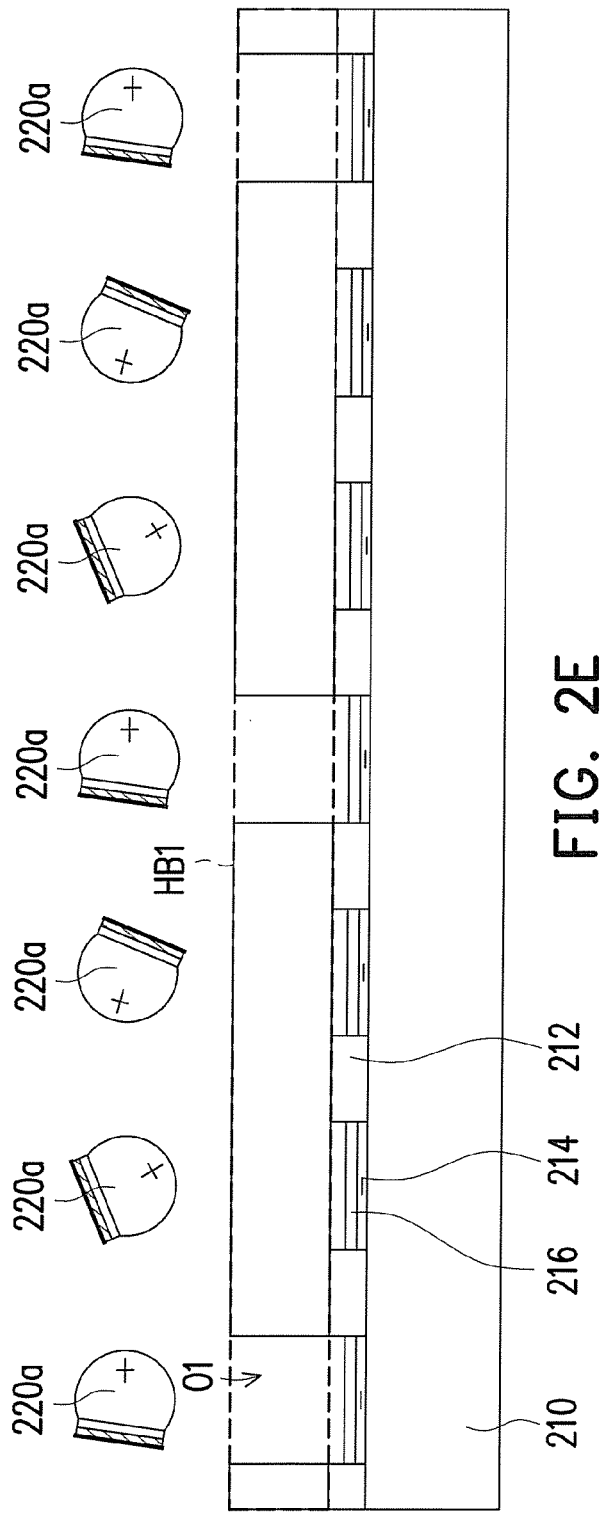
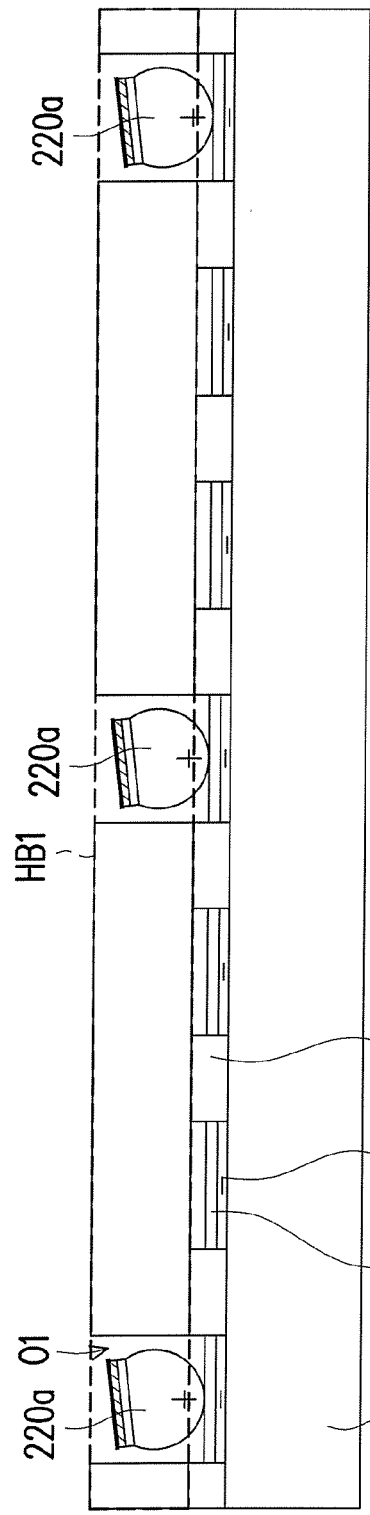
FIG. 2E
FIG. 2F

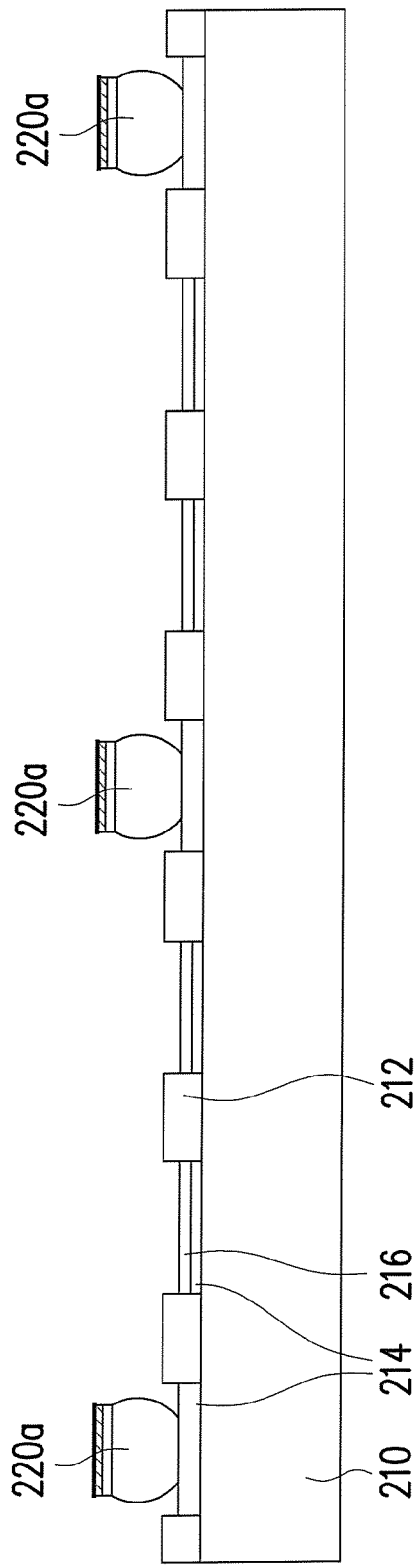
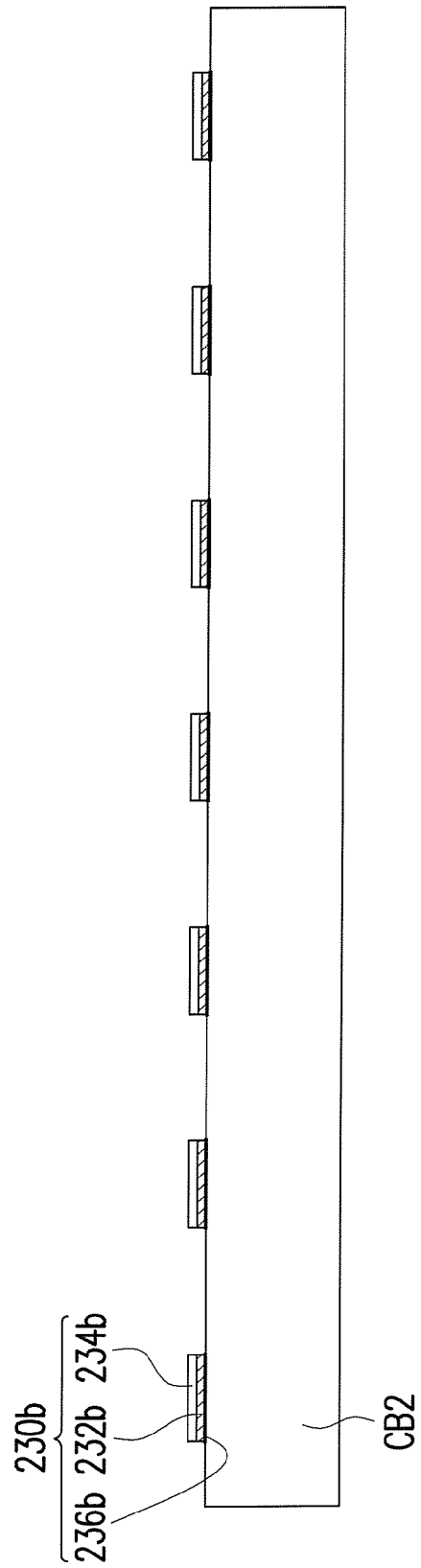

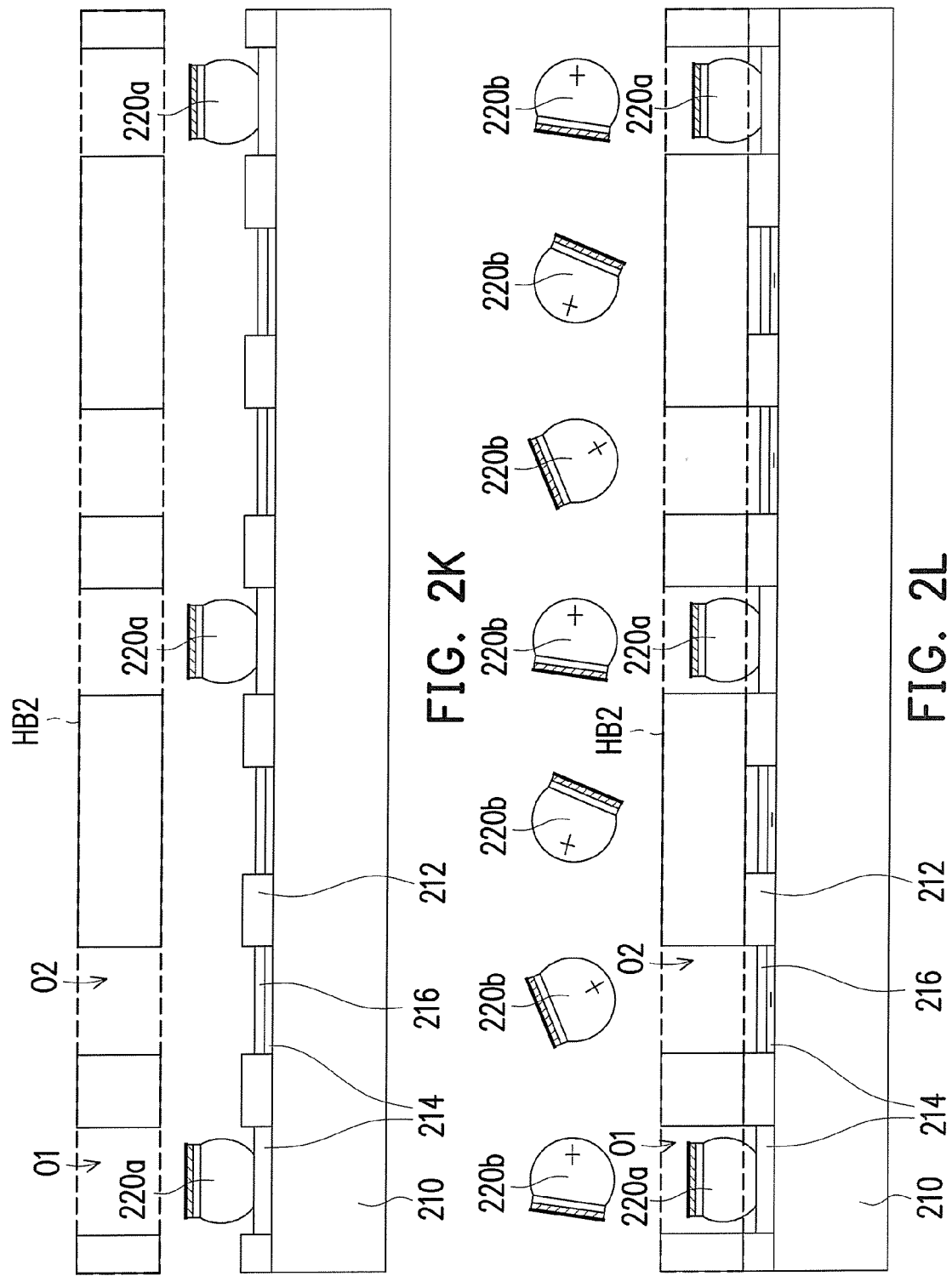

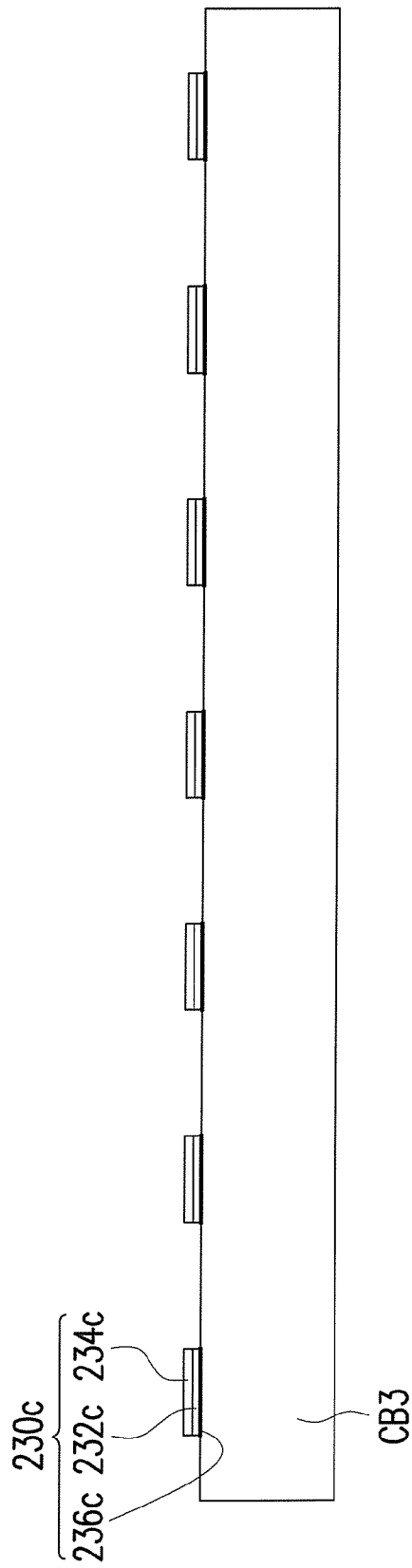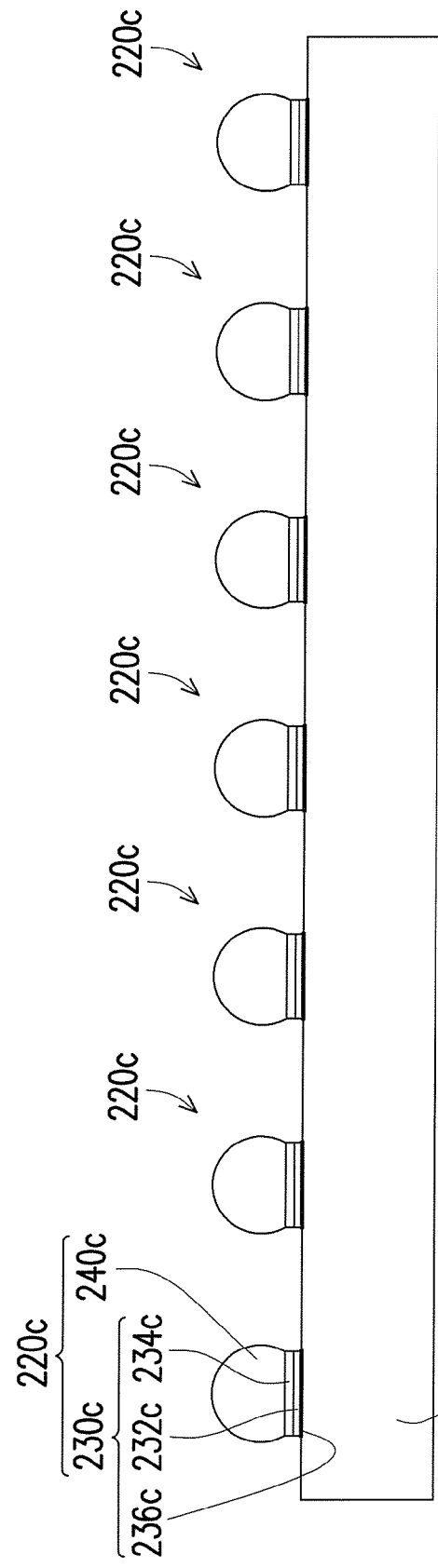

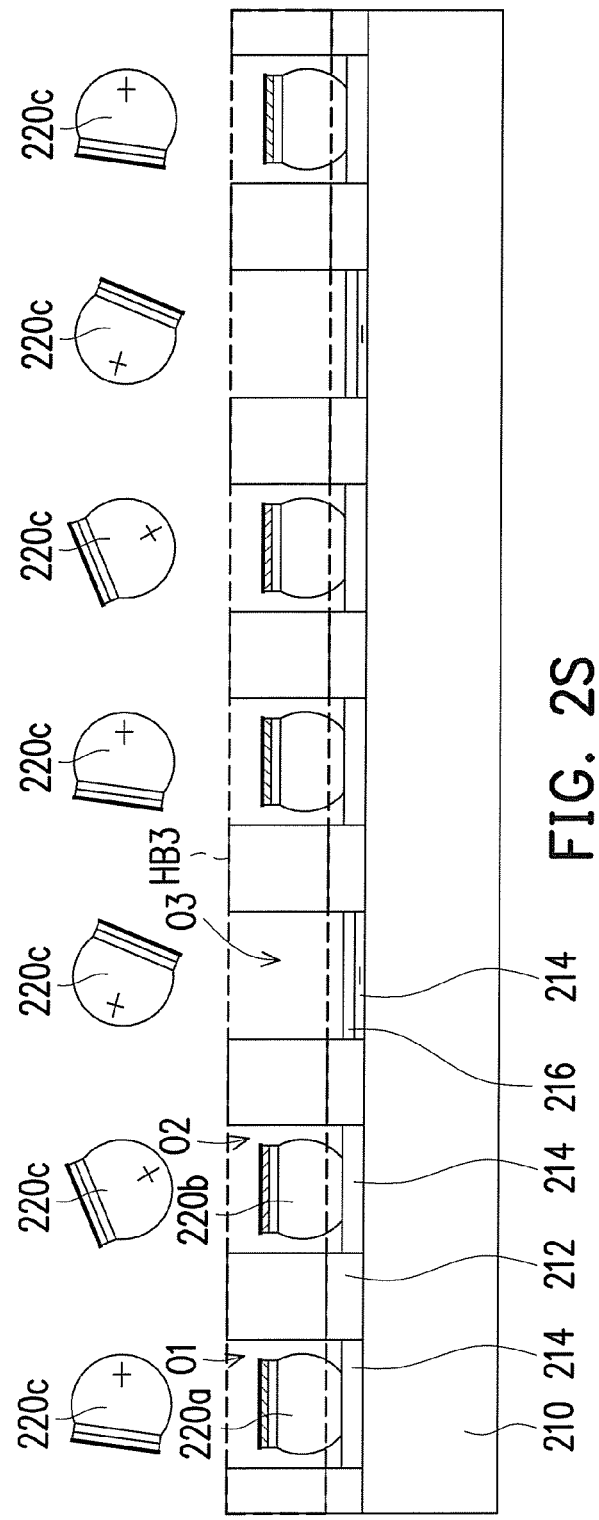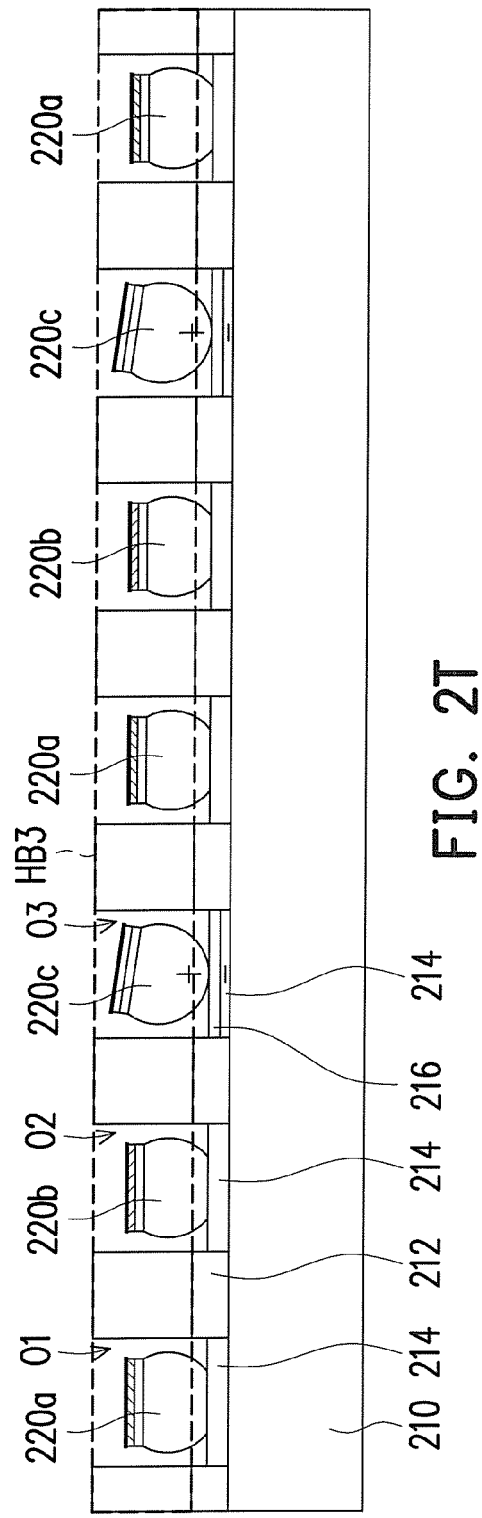

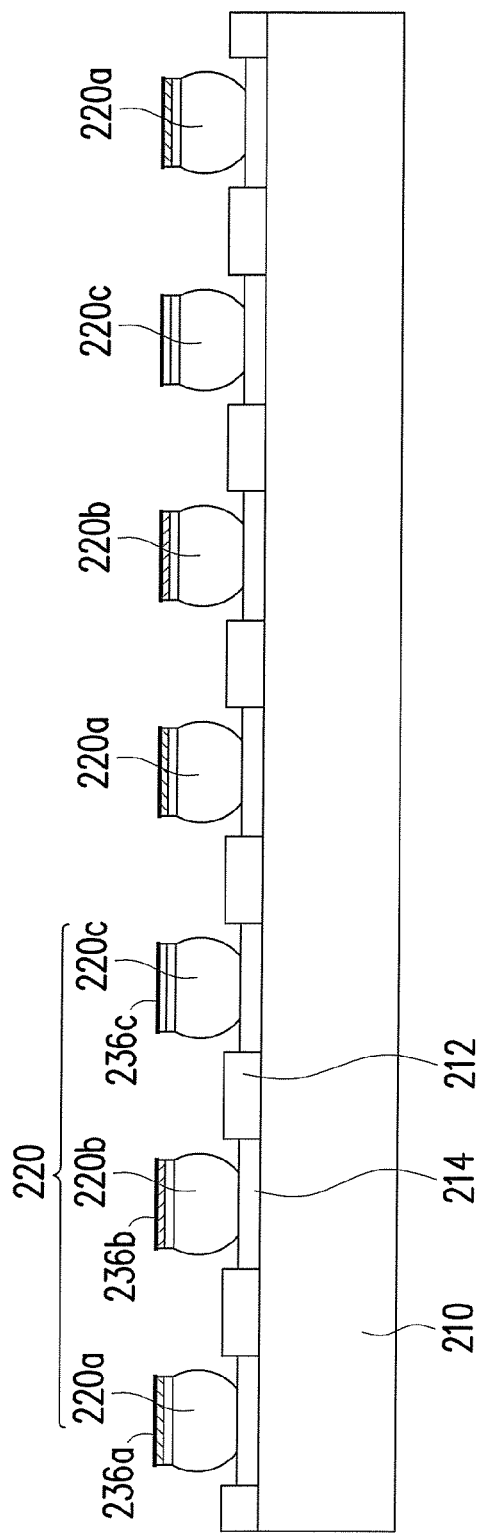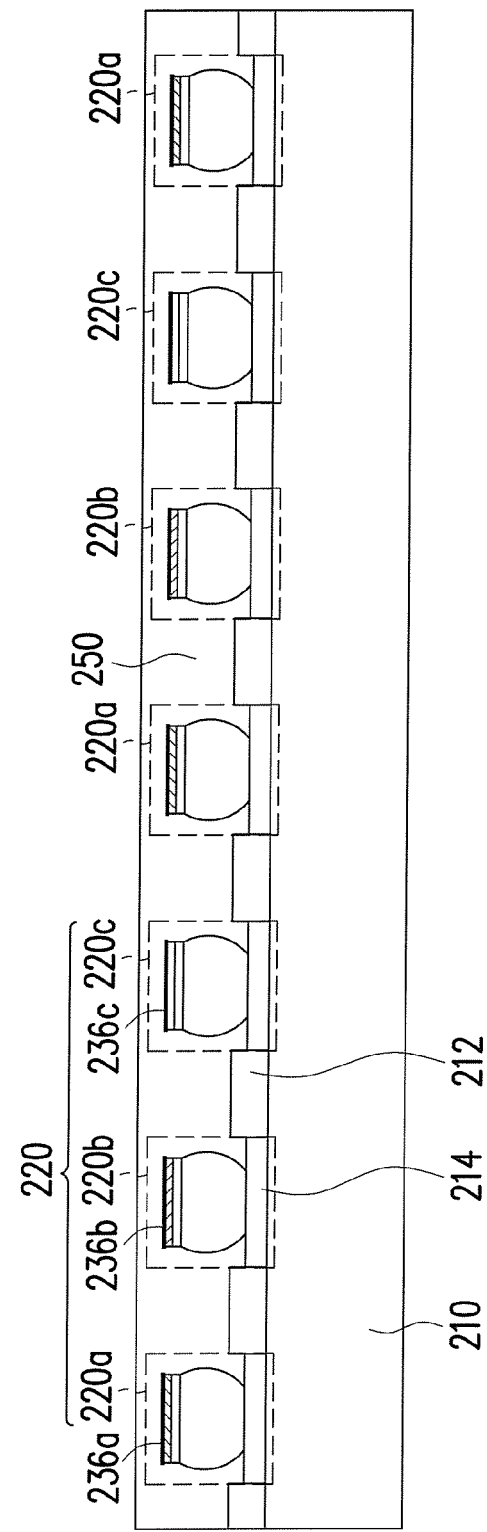
FIG. 2U
FIG. 2V

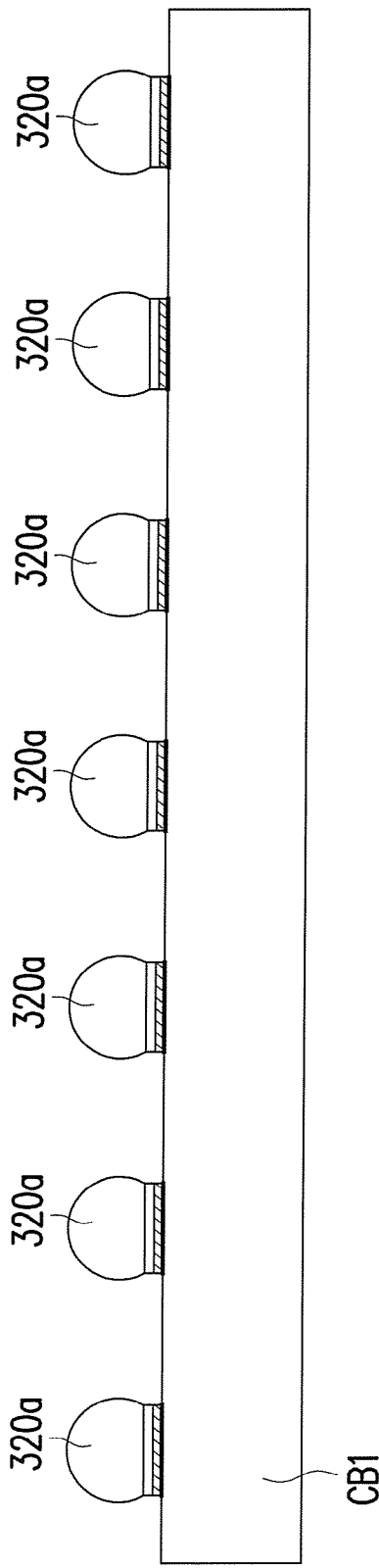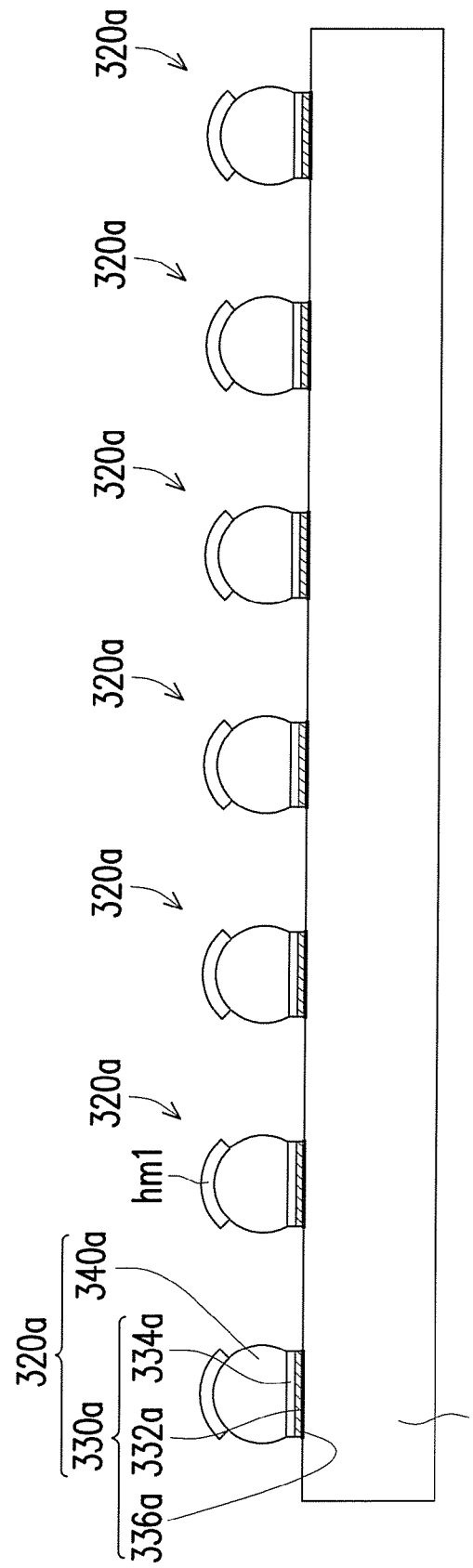

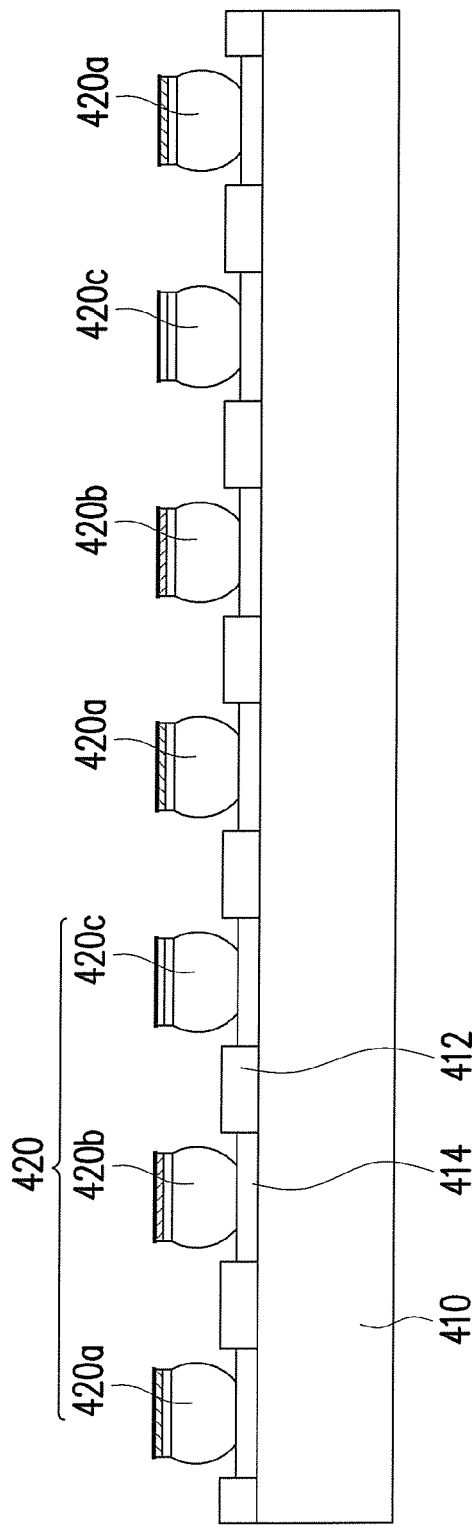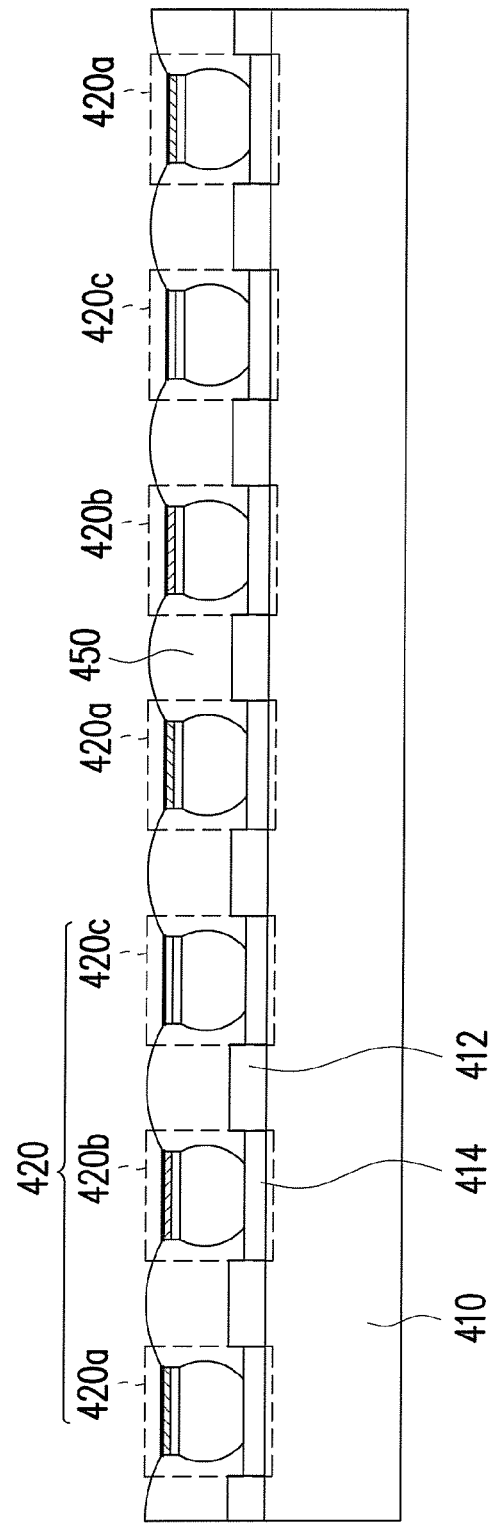

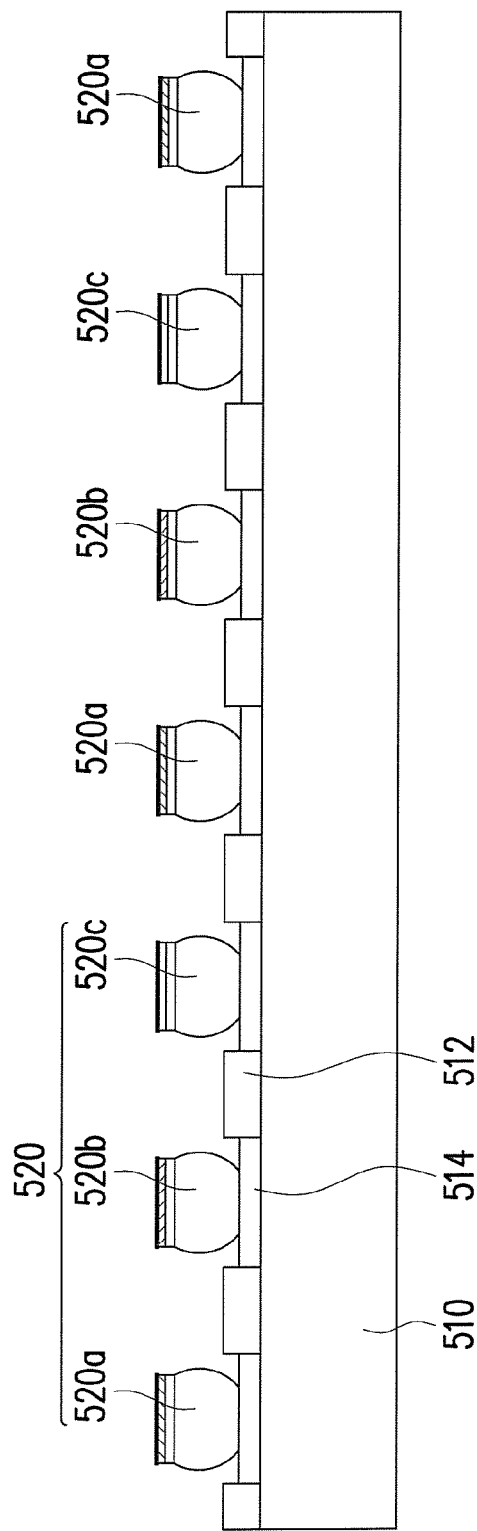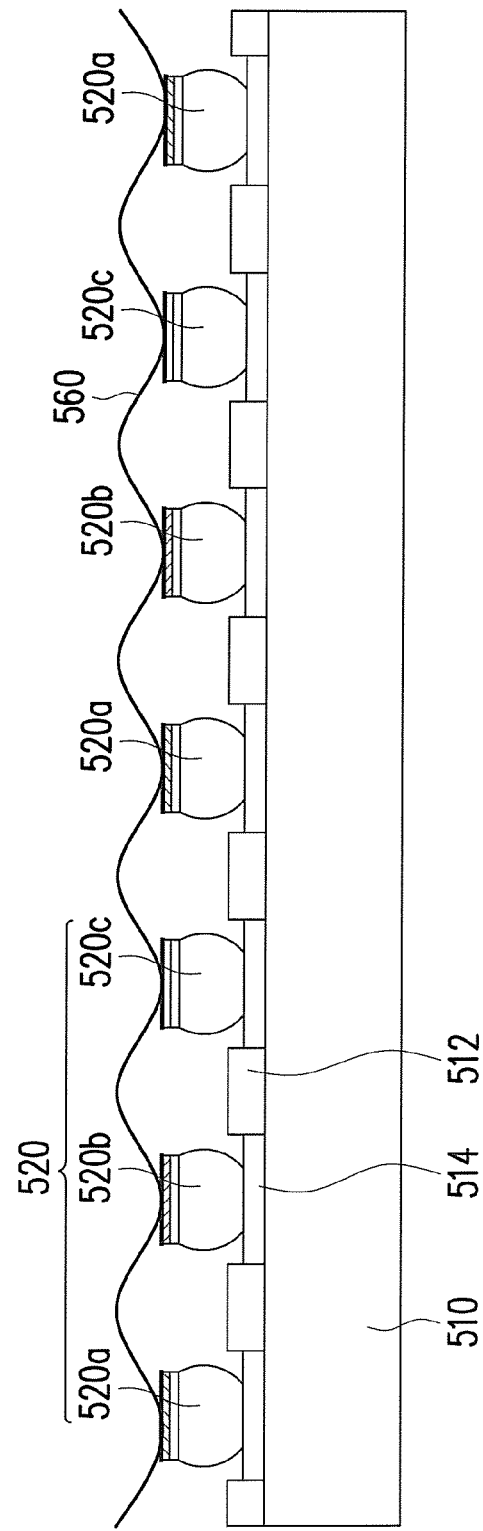

US 9,647,029 B2

LIGHT-EMITTING DEVICE AND MANUFACTURING METHOD OF A DISPLAY

CROSS-REFERENCE TO RELATED APPLICATION

This application claims the priority benefit of Taiwan application serial no. 104133337, filed on Oct. 12, 2015. The entirety of the above-mentioned patent application is hereby incorporated by reference herein.

TECHNICAL FIELD

The disclosure relates to a light-emitting device and a manufacturing method of a display.

BACKGROUND

As the improvement in the field of optoelectronic, the volume of optoelectronic devices are getting smaller by using techniques of micro-display. Because of the breakthrough of the manufacturing size of the light emitting diode (LED), the display made of micro-LED array draws highly attention in the business market. Displays made of micro-LEDs belong to active light emitting device displays. Micro-LEDs have similar contrast and energy consumption comparing to organic light emitting diodes, but much superior in reliability and life-time. Therefore, micro-LEDs have a great potential to be adapted to communication devices, internet of things, and displays of wearable electronics.

A display of micro-LEDs is made of LED arrays disposing on an electronic substrate, to form the pixels of the display. In the manufacturing process of the micro-LED display, the LEDs must be respectively arranged on the pre-determined position of contacts on the substrate. Therefore, alignment and packaging become important issues in manufacturing display of micro-LEDs.

SUMMARY

According to an embodiment of the disclosure, a light emitting device comprises a light emitting diode chip and a spherical extension electrode. The light emitting diode chip further includes a semiconductor epitaxial structure, a first electrode, and a second electrode, wherein the first electrode and the second electrode are disposed on two opposite sides of the semiconductor epitaxial structure, respectively. The first electrode is disposed between the semiconductor epitaxial structure and the spherical extension electrode, and the spherical extension electrode is electrically connected to the semiconductor epitaxial structure through the first electrode, wherein a volume of the spherical extension electrode is greater than that of the light emitting diode chip.

According to another embodiment of the disclosure, a manufacturing method of a display comprises: disposing a first porous plate on a first substrate including a plurality of pads, the first porous plate having a plurality of first openings corresponding to a part of the plurality of pads; providing a plurality of light emitting devices, wherein each of the light emitting device is as described in the aforementioned embodiment; proceeding a prior process to the plurality of light emitting devices and disposing the plurality of light emitting devices into the plurality of first openings, respectively, wherein proceeding the prior process facilitates to get a smooth contact between each of the plurality of spherical extension electrodes and each of the plurality of pads; bonding the plurality of spherical extension electrodes of the plurality of light emitting devices to the plurality of pads; and forming a common electrode electrically connected to the plurality of second electrodes.

The foregoing will become better understood from a careful reading of a detailed description provided herein below with appropriate reference to the accompanying drawings.

BRIEF DESCRIPTION OF THE DRAWINGS

FIGS. 3A to 3C are schematic views illustrating a part of processing flow of a manufacturing method of a display according to an embodiment of the disclosure.

FIGS. 4A to 4C are schematic views illustrating a part of processing flow of a manufacturing method of a display according to another embodiment of the disclosure.

FIGS. 5A to 5B are schematic views illustrating a part of processing flow of a manufacturing method of a display according to yet another embodiment of the disclosure.

DETAILED DESCRIPTION OF DISCLOSED EMBODIMENTS

Figure 1A:
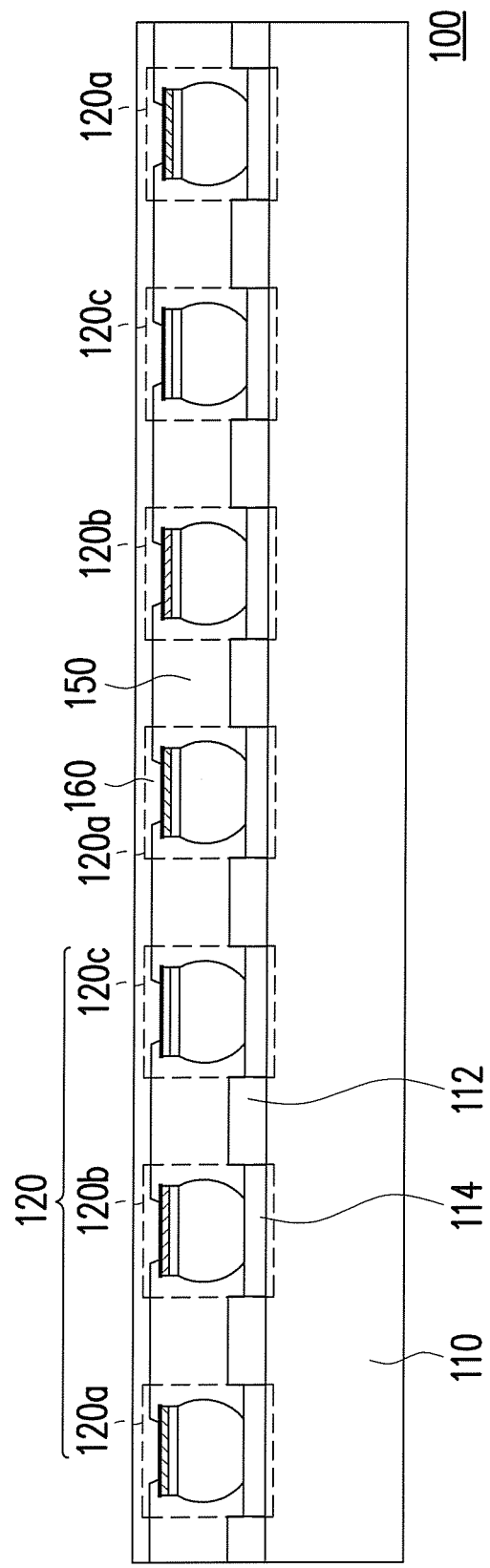
FIG. 1A is a cross sectional view of a display according to an embodiment of the disclosure.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Figure 1B:
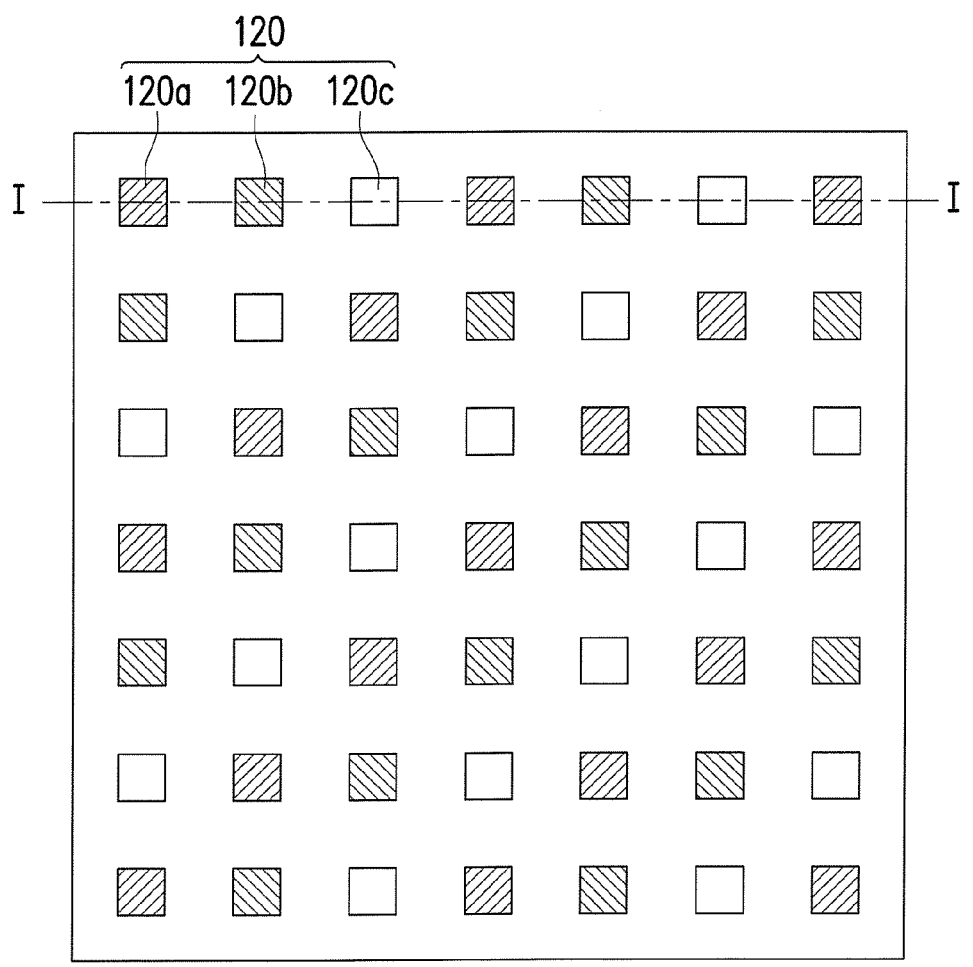
FIG. 1B is a top view of FIG. 1A according to an embodiment of the disclosure.

FIG. 1A is a cross sectional view of a display according to an embodiment of the disclosure. FIG. 1B is a top view of FIG. 1A according to the embodiment of the disclosure. In FIG. 1A, display 100 comprises a substrate 110 and a plurality of light emitting devices 120, and the plurality of light emitting devices 120 are disposed in arrays on the substrate 110. The plurality of light emitting devices 120 may emit light having colors at least of red, green, and blue. In an embodiment, each of the light emitting devices 120 may emit light of a single color or different colors, but the scope of the present disclosure is not limited thereto.

Referring to FIG. 1A and FIG. 1B, FIG. 1A is a cross sectional view along line I-I in FIG. 1B. In the embodiment, the plurality of light emitting devices 120 are divided into serval kinds of light emitting devices, for example, 120a, 120b, and 120c which are respectively emit light of different colors. The plurality of light emitting devices 120 disposed on the substrate 110 are formed as a plurality of arrays. The plurality of light emitting devices 120 may be, but not limited to LEDs or micro-LEDs, which represent as pixels in a display, respectively, to present a colorful display screen. In an embodiment, the plurality of light emitting devices 120 may be adapted to a projector to display colorful projection images. In the embodiment, the light emitting devices 120a emit light of red, the light emitting devices 120b emit light of green, and the light emitting devices 120c emit light of blue. The colors of light emitted by the plurality of light emitting devices and the arrangements of the plurality of light emitting devices on the substrate may be adjustable without being limited to the disclosed embodiments. For example, the colors of light and the arrangements of the plurality of LEDs on the substrate may be designed according to the different requirements, specifications or the product positioning strategy.

Figure 1C:
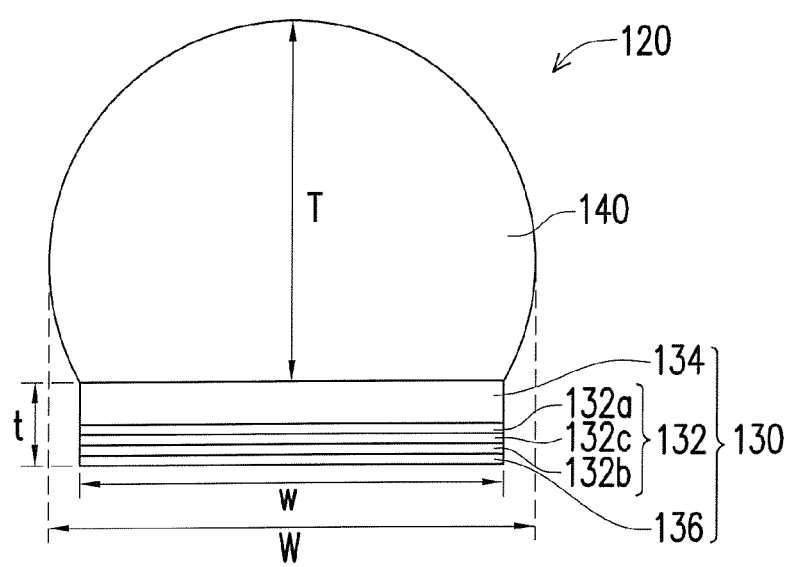
FIG. 1C is a cross sectional view of the light emitting device in FIG. 1A according to an embodiment of the disclosure.

FIG. 1C is a cross sectional view of the light emitting device in FIG. 1A according to the embodiment of the disclosure. In the embodiment, each of the light emitting devices 120 comprises a semiconductor epitaxial structure 132, a first electrode 134, and a second electrode 136. The first electrode 134 and the second electrode 136 are respectively disposed on two opposite sides of the semiconductor epitaxial structure 132, respectively. The semiconductor epitaxial structure 132 comprises a first type doped semiconductor layer 132a, a second type doped semiconductor layer 132b, and an illumination layer 132c. The illumination layer 132c is disposed between the first type doped semiconductor layer 132a and the second type doped semiconductor layer 132b. The first type doped semiconductor layer 132a is disposed between the first electrode 134 and the illumination layer 132c, and the second type doped semiconductor layer 132b is disposed between the second electrode 136 and the illumination layer 132c. In the embodiment, the first type doped semiconductor layer 132a is an N-type semiconductor layer, and the second type doped semiconductor layer 132b is a P-type semiconductor layer. The first electrode 134 is an N-type electrode corresponding to the N-type semiconductor layer, and the second electrode 136 is a P-type electrode corresponding to the P-type semiconductor layer. The illumination layer 132c may comprise multiple quantum wells. In an embodiment, the first type doped semiconductor layer 132a is a P-type semiconductor layer and the second type doped semiconductor layer 132b is an N-type semiconductor layer, the light emitting diode chip 130 further includes a protection layer, but the scope of the disclosure is not limited thereto. The protection layer covers the semiconductor epitaxial structure 132, part of the first electrode 134, and part of the second electrode 136. The light emitting devices 120 are electrically connected to external devices through the exposed parts of the first electrode 134 and second electrode 136. The illumination layer 132c may emit light when a current is applied.

Refer to FIG. 1C. Each of the light emitting devices 120 further includes a spherical extension electrode 140. The first electrode 134 is disposed between the semiconductor epitaxial structure 132 and the spherical extension electrode 140, and the spherical extension electrode 140 is electrically connected to the first type doped semiconductor layer 132a through the first electrode 134. The volume of the spherical extension electrode 140 is greater than that of the light emitting diode chip 130. The thickness T of the spherical extension electrode 140 is greater than the thickness t of the light emitting diode chip 130. The width W of the spherical extension electrode 140 is greater than the width w of the light emitting diode chip 130. In the embodiment, a material of the spherical extension electrode 140 may be, but not limited to Sn. The spherical extension electrode 140 may be connected to the pad 114 on the substrate 110 by a reflow process, so that the light emitting devices 120 may be electrically connected to a plurality of pads 114 (shown in FIG. 1A) on the substrate 110.

Refer to FIG. 1A and FIG. 1C, the light emitting devices 120, for example, including light emitting devices 120a, light emitting devices 120b, and light emitting devices 120c those may emit light of different colors, respectively. The substrate 110 comprises a circuit structure and a protection layer 112 on the surface of the substrate 110. The protection layer 112 covers part of the circuit structure, therefore, partial circuit structure may be exposed from the surface of the substrate 110 to form the plurality of pads 114. The plurality of pads 114 are electrically connected to the plurality of spherical extension electrodes 140 of the plurality of light emitting devices 120, respectively. The light emitting devices 120 are electrically connected to a common electrode 160 of the display 100 through the plurality of second electrodes 136. Each of light emitting devices 120 may be driven by a current provided by the circuit structure to emit light, to display images or projection images. In the embodiment, the substrate 110 may be, but not limited to a semiconductor substrate, a sub-mount, a complementary metal oxide semiconductor (CMOS) substrate, or a liquid crystal on silicon (LCOS) substrate. The plurality of pads 114 on the substrate 110 are made of conductive materials, which may be, but not limited to copper (Cu), aluminum (Al), and indium tin oxide (ITO).

Refer to FIG. 1A, the common electrode 160 is disposed on a surface of substrate 110 substantially opposite to the light emitting devices 120. The display 100 further comprises a non-conductive layer 150 disposed between the substrate 110 and the common electrode 160. The non-conductive layer 150 is also disposed between each of the adjacent light emitting devices 120, for example, between the light emitting devices 120a and 120b. The non-conductive layer 150 electrically isolates the circuit structure on the substrate 110 and the common electrode 160, to prevent the light emitting devices 120 from occurring short circuit.

Figure 2C:
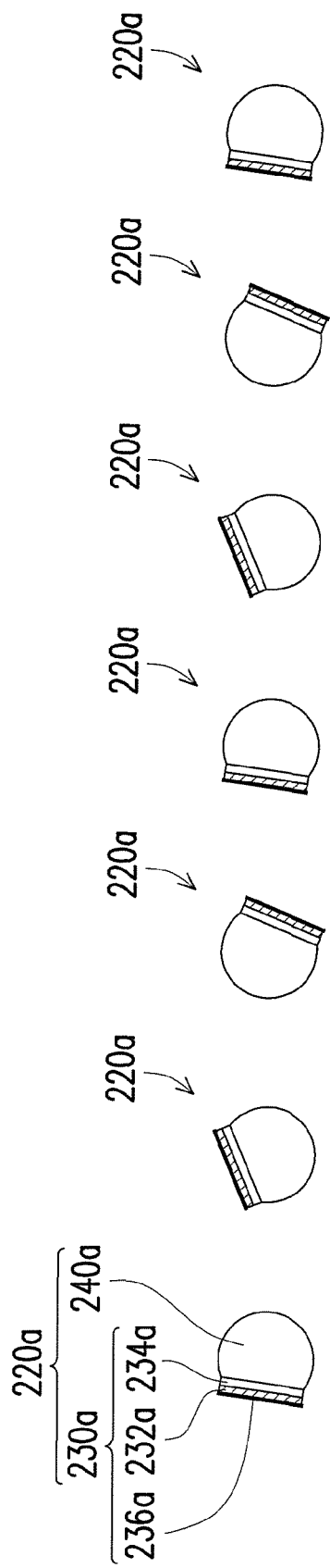
FIGS. 2A to 2X are schematic views illustrating the processing flow of a manufacturing method of a display according to an embodiment of the disclosure.
Figure 2D:
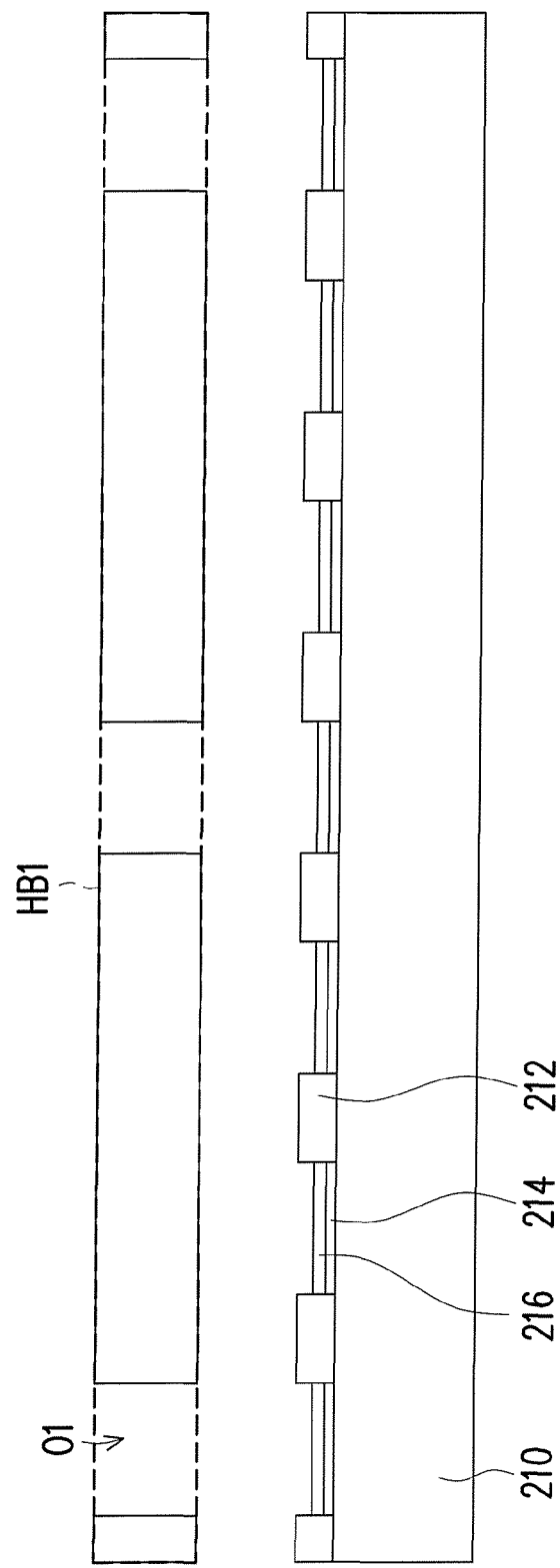
Figure 2I:
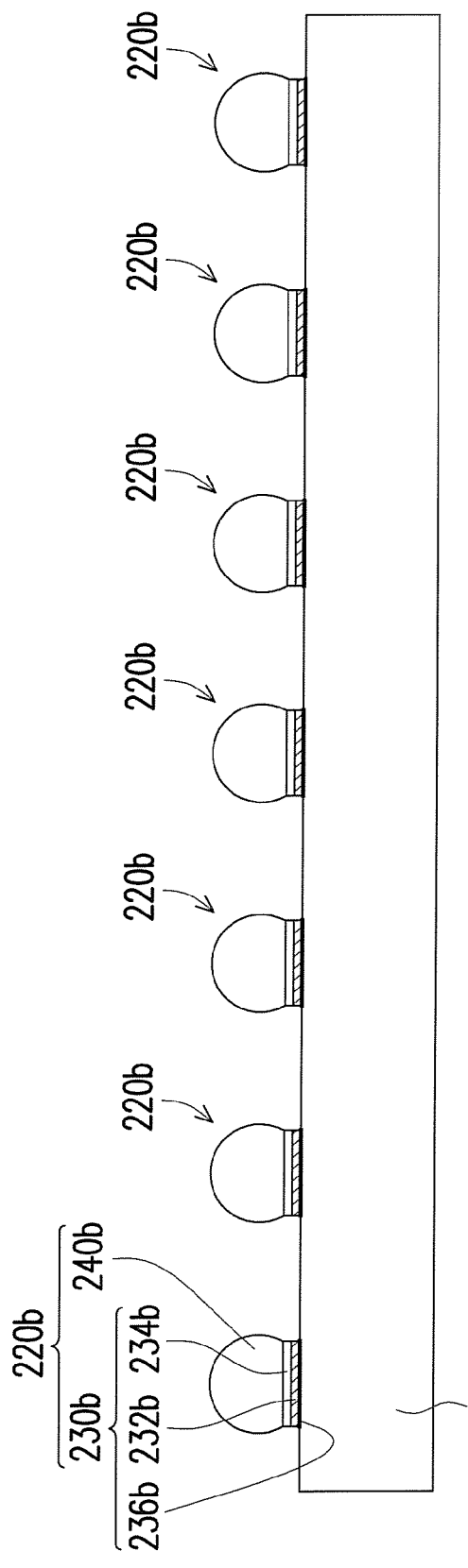
Figure 2J:
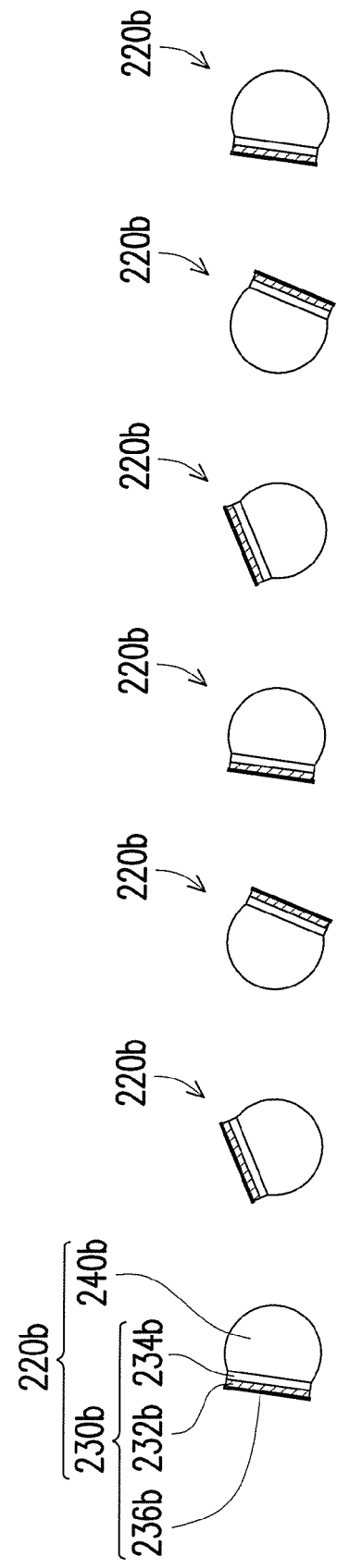
Figure 2M:
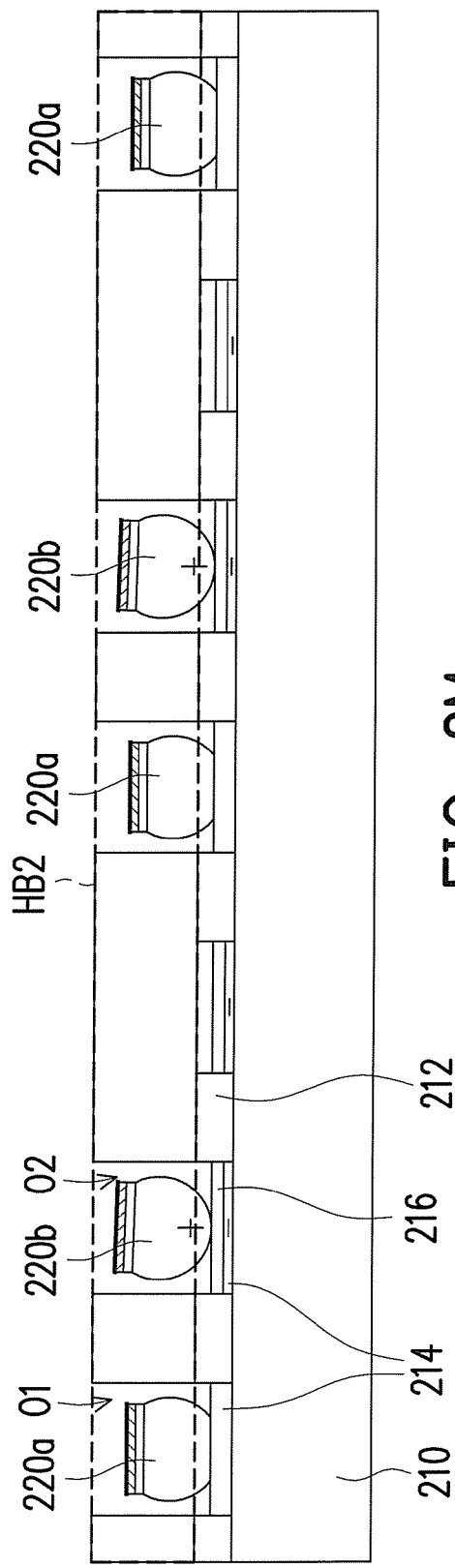
Figure 2N:
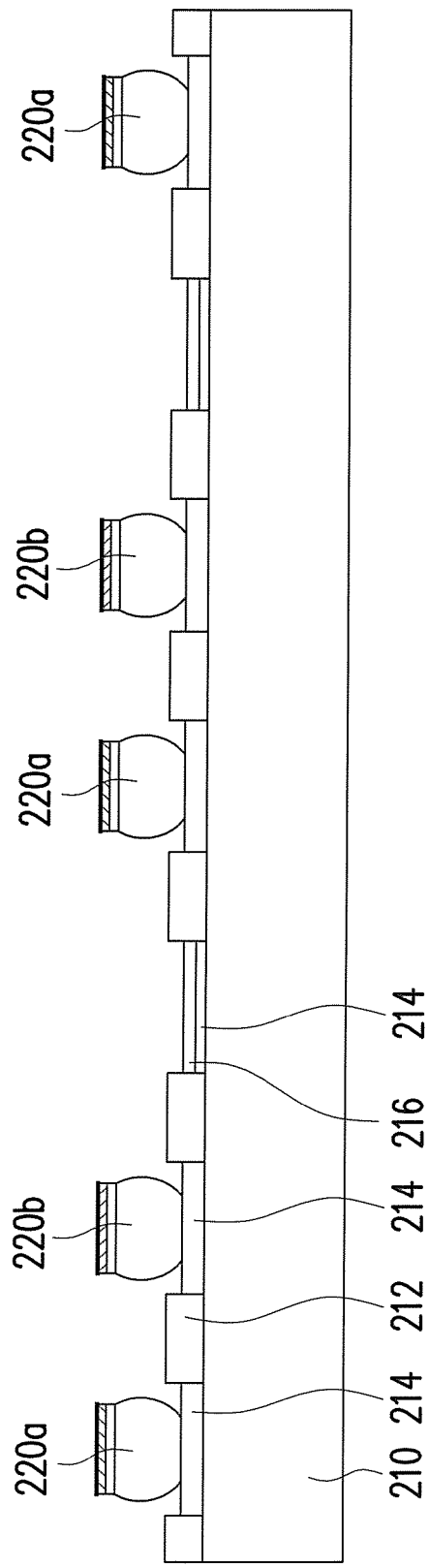
Figure 2Q:
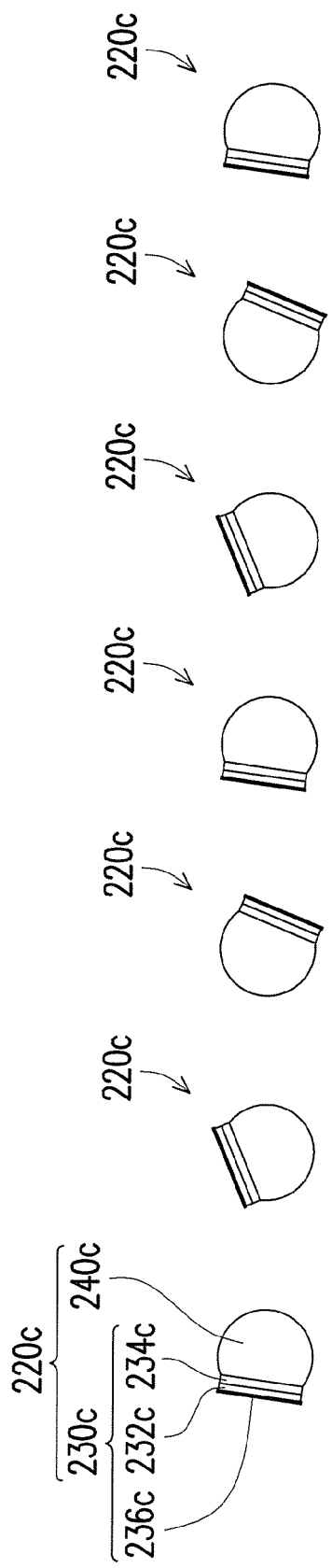
Figure 2R:
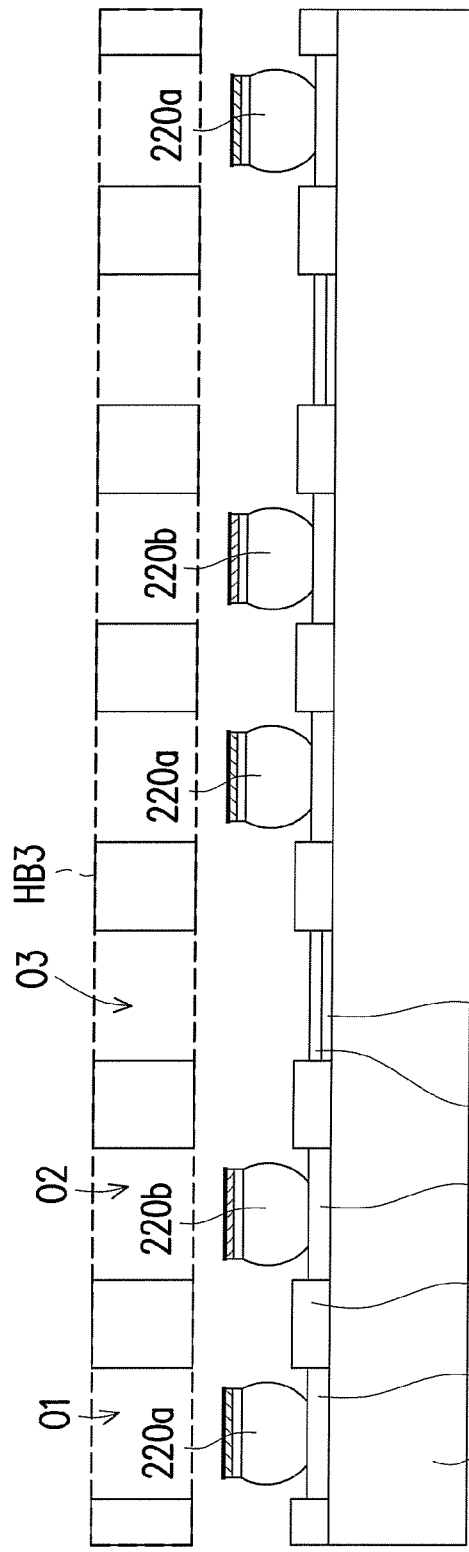
Figure 2W:
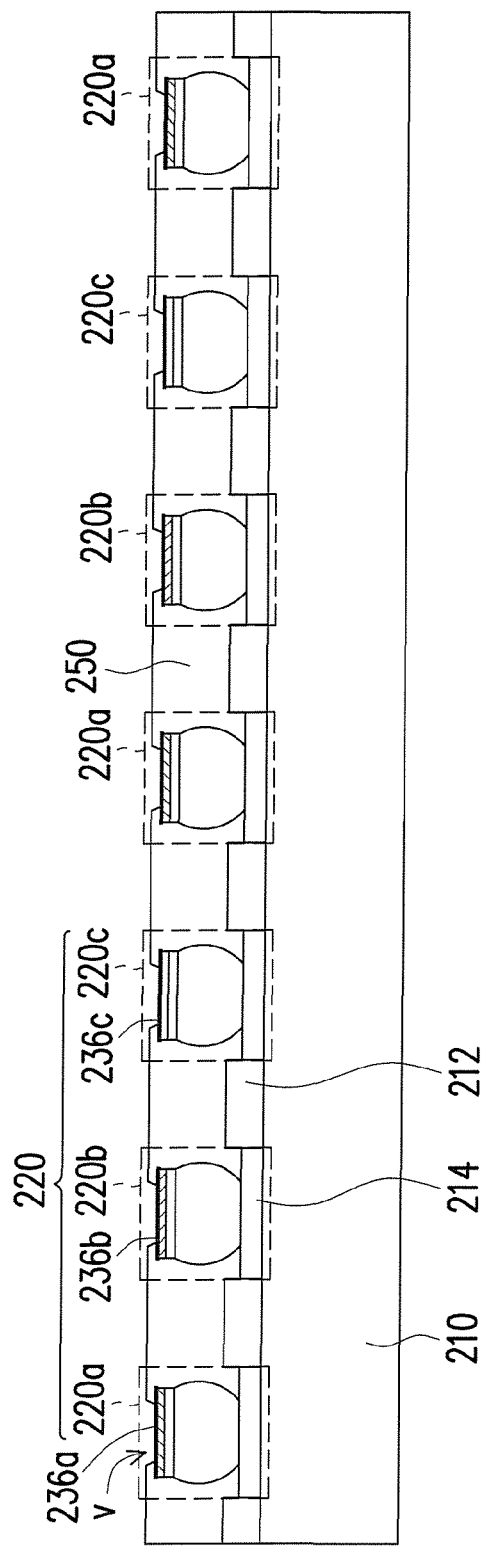
Figure 2X:
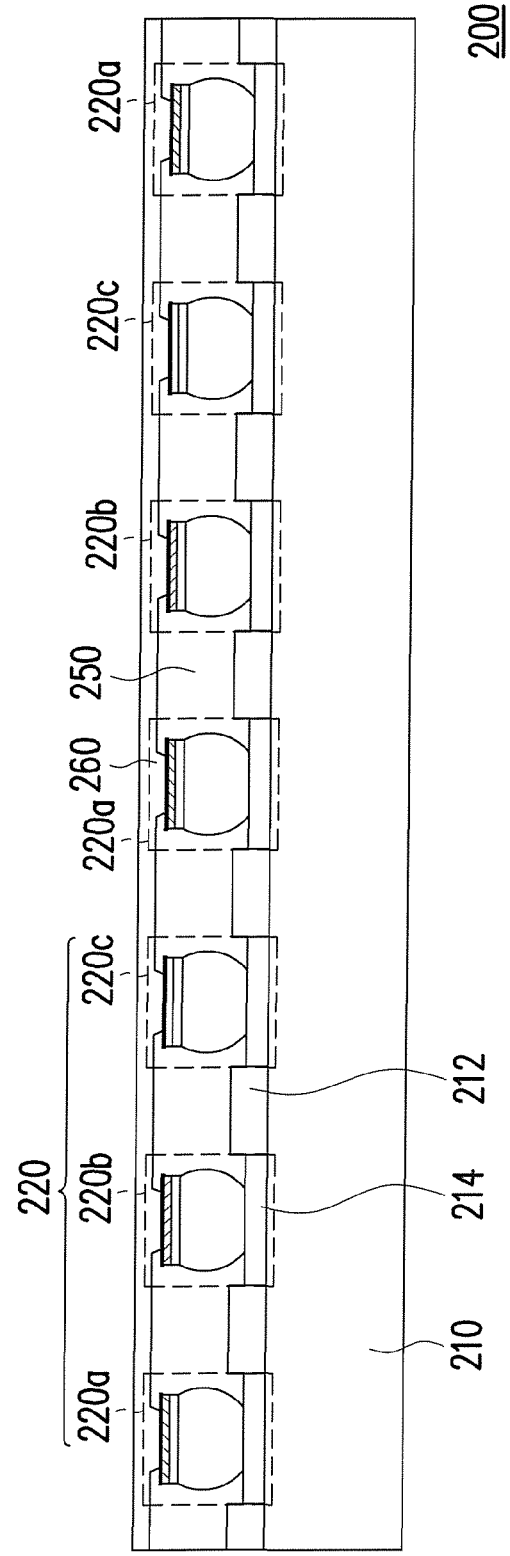

FIGS. 2A to 2X are schematic views illustrating the processing flow of a manufacturing method of a display according to another embodiment of the disclosure. Refer to FIG. 2A and FIG. 2B, the manufacturing method in the embodiment may at least be adapted to manufacture the display 100 of FIG. 1A. The display 200 of FIG. 2X is similar to the display 100 of FIG. 1A, the followings describe the difference between the display 200 and the display 100. The manufacturing method of the display 200 in the embodiment comprises sequentially forming second electrodes 236a, semiconductor epitaxial structures 232a and first electrodes 234a, and then spherical extension electrodes 240a are further formed on the first electrodes 234a.

Refer to FIG. 2C, the second electrodes 236a, the semiconductor epitaxial structures 232a, the first electrodes 234, and the spherical extension electrodes 240a are removed from a substrate CB1, to form a plurality of light emitting devices 220a. In the embodiment, the semiconductor epitaxial structures 232a, the first electrodes 234a, and the second electrodes 236a form light emitting diode chips 230a. The light emitting diode chips 230a and the spherical extension electrodes 240a form the light emitting devices 220a, respectively. In other words, a light emitting diode chip 230a and a spherical extension electrode 240a fo a light emitting device 220a; wherein the semiconductor epitaxial structure 232a, a first electrode 234a, and a second electrode 236a form the light emitting diode chip 230a. In the embodiment, the light emitting devices 220a are removed from s substrate CB1 by a laser lift-off or a chemical etching. In some embodiments, the light emitting devices 220a may be completely removed from the substrate CB1 at one time, or only a part of light emitting devices 220a may be removed at one time, but the scope of the disclosure it is not limited thereto.

Refer to FIG. 2D, a porous plate HB1 is disposed on the substrate 210 having a plurality of pads 214. The porous plate HB1 comprises a plurality of openings O1 corresponding to the pads 214, respectively. The porous plate HB1 may be halftone, and a material of the porous plate HB1 may be iron or other materials. In the embodiment, the substrate 210 comprises a plurality of protection layers 212 and a plurality of pads 214. The plurality of pads are coated with flux 216. Positions of the openings O1 of the porous plate HB1 correspond to positions of at least a part of the pads 214, respectively. The porous plate HB1 may contact the substrate 210 or not, but the scope of the disclosure is not limited thereto.

In the embodiment, the manufacturing method of a display further comprises a prior process applying to the light emitting devices 220a. Wherein the manufacturing method proceeds the prior process to facilitate a smooth contact between each of the plurality of spherical extension electrodes and each of the plurality of pads. The prior process may include applying static electricity to the spherical extension electrodes 240a, for example, each of the spherical extension electrodes 240a may carry a positive charge, as shown in FIG. 2E. The prior process may further include allowing the pads 214 to carry negative charges. In some embodiments, the prior process may further include applying negative charges to the spherical extension electrodes 240a, and applying positive charges to the pads 214, but the scope of the disclosure is not limited thereto. One exemplar of applying the static electricity to the spherical extension electrodes 240a is, the light emitting devices 220a are removed from the substrate CB1 by a manner of injecting the light emitting devices 220a from a nozzle. By the friction between the light emitting device 220a and the nozzle, the spherical extension electrodes 240a of the light emitting devices 220a carry the static electricity. One exemplar of applying the static electricity to the pads 214 is sending electric signals to the pads by using the circuit structure of the substrate 210.

Refer to FIG. 2E and FIG. 2F, the light emitting devices 220a are disposed in the openings O1, respectively. In the embodiment, the porous plate HB1 and the substrate 210 contact each other, and the volume of each of the openings O1 is large enough to accommodate a single light emitting device 220a. At first, the light emitting devices 220a removed from the substrate CB1 are disposed on one side of the substrate CB1 away from the substrate 210. By using a scheme of shaking sieve, the light emitting devices 220a are moved with respect to the substrate CB1 and then fall into the openings O1, respectively. The positions of the openings O1 corresponds to the positions of the pads 214, respectively. Because the volume of each spherical extension electrode 240a is greater than the volume of each light emitting diode chip 230a, the light emitting device 220a may flip itself and its spherical extension electrode 240a turns down while the light emitting device 220a is falling into the openings O1. This causes the spherical extension electrodes 240a of the light emitting devices 220a to contact the pads 214. In addition, the positive charge carried by the spherical extension electrodes 240a and the negative charge carried by the pads 214 make the spherical extension electrodes 240a and the pads 214 attract each other, also increase the chance of the spherical extension electrodes 240a contacting the pads 214. In other words, the plurality of spherical extension electrodes are charged with a static electricity, to have the plurality of spherical extension electrodes contact the plurality of pads by using a static-electricity attaching scheme. In an embodiment, the flux 216 may be used to stick the spherical extension electrodes 240a of the light emitting devices 220a, and this makes the spherical extension electrodes 240a contact the of pads 214 at the positions of the pads, respectively.

Refer to FIG. 2G, the spherical extension electrodes 240a are bonded to the pads 214. In an embodiment, bonding the spherical extension electrodes 240a includes a reflow process. During the reflow process, the spherical extension electrodes 240a are bonded to the pads 214 by the heat, and this causes the light emitting devices 220a to electrically connect the circuit structure of the substrate 210 through the pads 214. As a result of heating the spherical extension electrodes 240a during the reflow process, the spherical extension electrodes 240a become flowing. After the reflow process, the light emitting diode chips 230a are rotated to be parallel to the substrate 210.

Refer to FIG. 2H, FIG. 2I, and FIG. 2J, the second electrodes 236b, the semiconductor epitaxial structures 232b, the first electrodes 234b, and the spherical extension electrodes 240b are sequentially disposed on the substrate CB2. Then, the second electrodes 236b, the semiconductor epitaxial structures 232b, the first electrodes 234b, and the spherical extension electrodes 240b are removed from the substrate CB2, to form a plurality of light emitting devices 220b. In the embodiment, the semiconductor epitaxial structures 232b, the first electrodes 234b, and the second electrodes 236b form the light emitting diode chips 230b. The light emitting diode chips 230b and the spherical extension electrodes 240b form the light emitting devices 220b. In the embodiment, the light emitted by the light emitting devices 220b is green, and the scheme of removing the light emitting devices 220b from the substrate CB2 is same as the scheme of removing the light emitting devices 220a from the substrate CB1.

Refer to FIG. 2K, the porous plate HB2 is disposed on the substrate 210 after the porous plate HB1 is removed. The porous plate HB2 comprises a plurality openings O2 corresponding to at least a part of the pads 214, and a plurality openings O1. The positions of the pads 214 corresponding to the plurality openings O1 of the porous plate HB2 are same as the positions of the pads 214 corresponding to the openings O1 of the porous plate HB1. Each of the openings O1 of the porous plate HB2 has an enough volume to accommodate a single light emitting device 220a, and this makes the porous plate HB2 contacts the substrate 210 or substantially close to the substrate 210.

Then, a similar prior process is applied to the light emitting devices 220b, which also applies static electricity to the spherical extension electrodes 240b and the pads 214 on the substrate, which causes the spherical extension electrodes 240b to carry the static electricity that may make the spherical extension electrodes 240b and the pads 214 attract each other. For example, the spherical extension electrodes 240b carry positive charges, and the pads 214 carry negative charges, as shown in FIG. 2L.

Refer to FIG. 2L and FIG. 2M, each of the light emitting devices 220b is disposed in a corresponding one of the openings O2, and this disposition manner is same as disposing the light emitting devices 220a. In the embodiment, each of the openings O2 has an enough volume to accommodate a single light emitting device 220b. Because the openings O1 on the porous plate HB2 are already filled with the light emitting devices 220a, the light emitting devices 220b will fall into the openings O2. Because the volume of each spherical extension electrode 240b is greater than the volume of each light emitting diode chip 230b, the spherical extension electrode 240b of the light emitting device 220b turns down while the light emitting device 220*b* is falling into the openings O2. This makes the spherical extension electrodes 240*b* of the light emitting devices 220*b* may contact the pads 214. In addition, the spherical extension electrodes 240*b* carries the static electricity. This makes the spherical extension electrodes 240 band the pads 214 attract each other via the static-electricity attaching, also increases the chance of the spherical extension electrodes 240*b* contacting the pads 214.

Refer to FIG. 2N, the spherical extension electrodes 240*b* are bonded to the pads 214. In the embodiment, bonding the spherical extension electrodes 240*b* to the pads is same as bonding the spherical extension electrodes 240*a* to the pads 214. The detailed have been described above and not repeated here.

Refer to FIG. 2O, FIG. 2P, and FIG. 2Q, second electrodes 236*c*, semiconductor epitaxial structures 232*c*, first electrodes 234*c*, and spherical extension electrodes 240*c* are sequentially formed on the substrate CB3. Then, the second electrodes 236*c*, the semiconductor epitaxial structures 232*c*, the first electrodes 234*c*, and the spherical extension electrodes 240*c* are removed from the substrate CB3 to form a plurality of light emitting devices 220*c*. In the embodiment, the semiconductor epitaxial structures 232*c*, the first electrodes 234*c*, and the second electrodes 236*c* form the light emitting diode chips 230*c*. The light emitting diode chips 230*c* and the spherical extension electrodes 240*c* form the light emitting devices 220*c*. Removing the light emitting devices 220*c* from the substrate CB3 is same as removing the light emitting devices 220*b* from the substrate CB2. The detailed have been described above and not repeated here.

Refer to FIG. 2R, the porous plate HB3 is disposed on the substrate 210 after the porous plate HB2 is removed. The porous plate HB3 comprises a plurality openings O3 corresponding to at least a part of the pads 214, a plurality of openings O1 and a plurality of openings O2. The positions of the openings O1 of the porous plate HB3 are same as the positions of the openings O1 of the porous plate HB1, and the positions of the openings O2 of the porous plate HB3 are same as the positions of the openings O2 of the porous plate HB2. The openings O1 of the porous plate HB3 may accommodate light emitting devices 220*a* on the substrate 210, and the openings O2 of the porous plate HB3 may accommodate light emitting devices 220*b* on the substrate 210. This makes the porous plate HB3 contacts the substrate 210 or substantially close to the substrate 210.

Refer to FIG. 2S and FIG. 2T, the prior process is applied to the light emitting devices 220*c*, therefore, static electricity is applied to the spherical extension electrodes 240*c*, as shown in FIG. 2S. Then, the light emitting devices 220*c* are disposed in the openings O3, respectively. The deposition is as disposing the light emitting devices 220*b* in the openings O2. In the embodiment, each of the openings O3 has an enough volume to accommodate a single light emitting device 220*c*. Because the openings O1 and openings O2 on the porous plate HB3 are already filled with the light emitting devices 220*a* and light emitting devices 220*b*, the light emitting devices 220*c* will fall into the openings O3. Because the volume of each spherical extension electrode 240*c* is greater than the volume of each light emitting diode chip 230*c*, each spherical extension electrode 240*c* of each light emitting device 220*c* turns down while the light emitting device 220*c* is falling into the openings O3. This makes the spherical extension electrodes 240*c* of the light emitting devices 220*c* may contact the pads 214. In addition, the spherical extension electrodes 240*c* carries the static electricity. This makes the spherical extension electrodes 240*c* and the pads 214 attract each other via the static-electricity attaching, also increases the chance of the spherical extension electrodes 240*c* contacting the pads 214. In other words, proceeding the prior process may facilitate a smooth contact between each of the spherical extension electrodes 240*c* and each of the pads 214.

Refer to FIG. 2U, FIG. 2V, FIG. 2W, and FIG. 2X, the spherical extension electrodes 240*c* are bonded to the pads 214. In the embodiment, the method of bonding the spherical extension electrodes 240*c* to the pads is same as the method of bonding the spherical extension electrodes 240*b* to the pads. Then, a non-conductive layer 250 is formed on the light emitting devices 220 (for example, a plurality of light emitting devices 220*a*, a plurality of light emitting devices 220*b*, and a plurality of light emitting devices 220*c*) of the substrate 210. The non-conductive layer 250 is also formed between every two adjacent light emitting devices of the light emitting devices 220*a*, 220*b*, and 220*c* 220*a*, 220*b*, and 220*c* on the substrate 210. Part of the non-conductive layer 250 on each light emitting device and away from the side facing the substrate 210 is removed to expose the second electrodes 236*a*, 236*b*, and 236*c* of the light emitting devices 220*a*, 220*b*, and 220*c*, respectively, to form a plurality of openings v. A common electrode 260 is formed on a side of the light emitting devices 220 which is away from the substrate 210. The second electrodes 236*a*, 236*b*, and 236*c* of the light emitting devices 220 are electrically connected to the common electrode 260 through the openings v.

In an embodiment, a manufacturing method of the display 200 comprises: disposing a first porous plate on a substrate including a plurality of pads, wherein the first porous plate has a plurality of first openings corresponding to a part of the plurality of pads; providing a plurality of light emitting devices; proceeding a prior process to the plurality of light emitting devices, and disposing the plurality of the light emitting devices in the plurality of first openings, respectively, wherein proceeding the prior process facilitates to get a smooth contact between each of the plurality of spherical extension electrodes and each of the plurality of pads; bonding the plurality of spherical extension electrodes of the plurality of light emitting devices to the plurality of pads; and forming a common electrode electrically connected to the plurality of second electrodes. According to the method of the embodiment, light emitting devices 220*a* emitting the red color may be packaged in the display 200. By repeating the method described above, light emitting devices 220*b* emitting the blue color and light emitting devices 220*c* emitting the green color may be also packaged in the display 200. In other embodiments, the repeating times of the manufacturing method may be adjustable to package more or less colors of light emitting devices in one display 200, but the scope of the disclosure is not limited thereto.

Figure 3C:
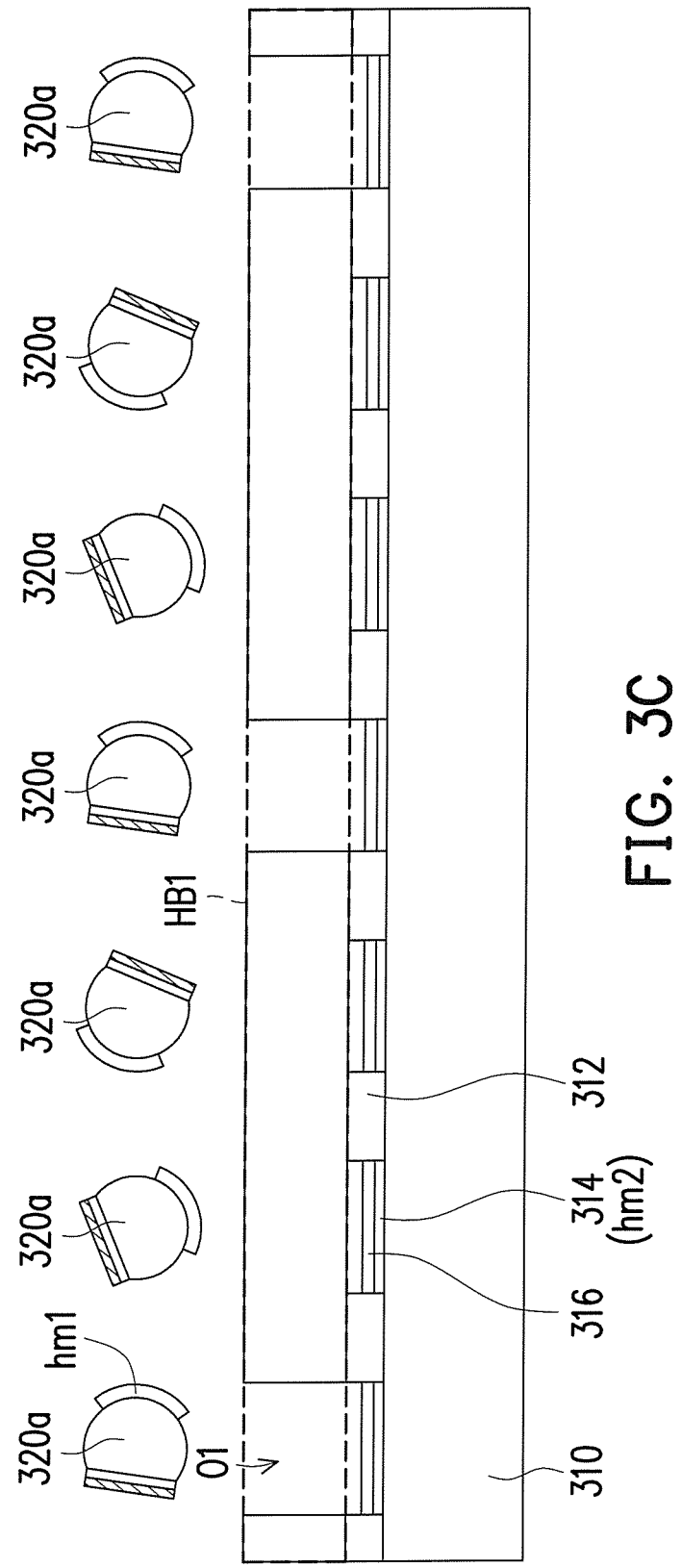

FIGS. 3A to 3C are schematic views of a part of a manufacturing process of a display according to another embodiment of the disclosure. The manufacturing method of FIGS. 3A to 3C is similar to the manufacturing method of FIGS. 2A to 2X. In addition to the aforementioned steps of the manufacturing method of FIGS. 2A to 2X, the embodiment in FIGS. 3A to 3C further includes: forming a hydrophilic material hm1 on spherical extension electrodes 340*a*. The hydrophilic material hm1 and the light emitting diode chips 330*a* are respectively disposed on two sides of the spherical extension electrode 340*a*, respectively. After the disposition, light emitting devices 320*a* are removed from the substrate CB1, and the light emitting devices 320*a* falls on the positions of the pads 314 on a substrate 310 via the openings O1. This makes the spherical extension electrodes 340a have a higher chance to contact to the pads 314 by the attraction of the hydrophilic material hm1. In the embodiment of FIGS. 3A to 3C, the substrate 310 comprises a protection layer 312, pads 314, and flux 316 on the pads 314. An additional hydrophilic material hm2 may be disposed on the pads 314, while whether or not the hydrophilic material hm2 is disposed is optional. By the attraction of the hydrophilic material hm1 and hm2, the spherical extension electrodes 340a have an even higher chance to contact the pads 314. In some embodiments, the hydrophilic material may be replaced by lipophilic materials, but the scope of the disclosure is not limited thereto. In an embodiment, the hydrophilic material hm1 may be disposed on both the spherical extension electrodes 3401 and the pads 314 to help the light emitting devices contacting the pads 314.

Figure 4C:
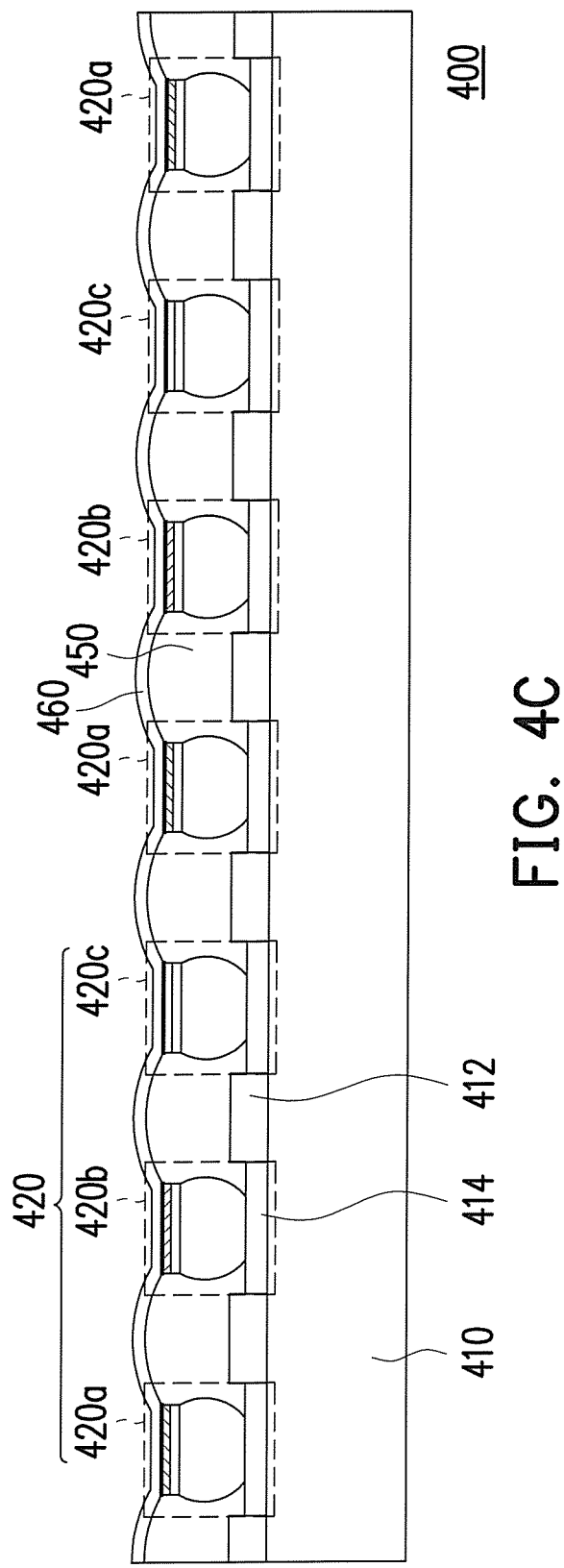

FIGS. 4A to 4C are schematic views illustrating a part of processing flow of a manufacturing method of a display according to yet another embodiment of the disclosure. The manufacturing method of the embodiment is similar to the manufacturing method of FIGS. 2A to 2X. In the embodiment of FIGS. 4A to 4C, a non-conducting layer 450 is further disposed on adjacent light emitting devices 420 comparing to the manufacturing method of FIGS. 2A to 2X. The light emitting devices 420 comprises light emitting devices 220a, 220b, and 220c. Then, a common electrode 460 is formed on the light emitting device 420 and the non-conductive layer 450. The common electrode 460 is electrically connected to the second electrodes of the light emitting devices 420. In the embodiment of FIGS. 4A to 4C, the non-conductive layer 450 disposed between adjacent light emitting devices 420 has a side surface that is away from the substrate 410 and is not flat. Also, the common electrode 460 has a side surface that is away from the substrate 410 and is not flat.

FIGS. 5A to 5B are schematic views illustrating a part of processing flow of a manufacturing method of a display according to yet another embodiment of the disclosure. The manufacturing method of the embodiment in FIGS. 5A to 5B is similar to the manufacturing method of FIGS. 2A to 2X. In the embodiment of FIGS. 5A to 5B, a common electrode 560 is further disposed on the light emitting devices 520. The light emitting devices 520 comprises light emitting devices 520a, light emitting devices 520b, and light emitting devices 520c. The common electrode 560 is electrically connected to the second electrodes of the light emitting devices 520. In the embodiment of FIGS. 5A to 5B, the method of forming the common electrode 560 comprises a wired bonding of the second electrodes by a single wire, and this makes the light emitting devices 520 are electrically connected.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A light emitting device, comprising:
a light emitting diode chip, further including a semiconductor epitaxial structure, a first electrode, and a second electrode, wherein the first electrode and the second electrode are disposed on two opposite sides of the semiconductor epitaxial structure, respectively; and
a spherical extension electrode, the first electrode is disposed between the semiconductor epitaxial structure and the spherical extension electrode, and the spherical extension electrode is electrically connected to the semiconductor epitaxial structure through the first electrode, wherein a volume of the spherical extension electrode is greater than that of the light emitting diode chip.

2. The light emitting device as claimed in claim 1, wherein a thickness of the spherical epitaxial structure is larger than that of the light emitting diode chip.

3. The light emitting device as claimed in claim 1, wherein a width of the spherical epitaxial structure is greater than that of the light emitting diode chip.

4. The light emitting device as claimed in claim 1, wherein the semiconductor epitaxial structure further includes:
a first type doped semiconductor layer;
a second type doped semiconductor layer; and
an illumination layer, disposed between the first type doped semiconductor layer and the second type doped semiconductor layer, wherein the spherical extension electrode is electrically connected to the first type doped semiconductor layer through the first electrode.

5. The light emitting device as claimed in claim 4, wherein one of the first type doped semiconductor layer and the second type doped semiconductor layer is an N type semiconductor layer, and another of the first type doped semiconductor layer and the second type doped semiconductor layer is a P type semiconductor layer.

6. The light emitting device as claimed in claim 4, further including a hydrophilic material, wherein the hydrophilic material is disposed on the spherical extension electrode, and the hydrophilic material and the light emitting diode chip are respectively disposed on two opposite sides of the spherical extension electrode, respectively.

7. A manufacturing method of a display, comprising:
(a) disposing a first porous plate on a first substrate including a plurality of pads, the first porous plate having a plurality of first openings corresponding to a part of the plurality of pads;
(b) providing a plurality of light emitting devices, wherein each of the light emitting device is as claimed in claim 1;
(c) proceeding a prior process to the plurality of light emitting devices and disposing the plurality of light emitting devices into the plurality of first openings, respectively, wherein proceeding the prior process facilitates a smooth contact between each of the plurality of spherical extension electrodes and each of the plurality of pads;
(d) bonding the plurality of spherical extension electrodes of the plurality of light emitting devices to the plurality of pads; and
(e) forming a common electrode electrically connected to the plurality of second electrodes.

8. The manufacturing method as claimed in claim 7, further including:
removing the first porous plate and disposing a second porous plate on the substrate, and the second porous plate further including a plurality of second openings corresponding to at least a part of the pads, wherein the plurality of first openings are different with the plurality of second openings;
repeating steps from (b) to (d) for bonding the plurality of light emitting devices and the plurality of pads.

9. The manufacturing method as claimed in claim 7, wherein the prior process further includes:
charging the plurality of spherical extension electrodes with a static electricity, to have the plurality of spherical extension electrodes contact the plurality of pads via a static-electricity attaching.

10. The manufacturing method as claimed in claim 7, wherein the prior process further includes:
   forming a hydrophilic material on the plurality of spherical extension electrodes, as to have the plurality of spherical extension electrodes contact the plurality of pads via the hydrophilic material.

11. The manufacturing method as claimed in claim 7, wherein providing the plurality of light emitting devices further includes:
   sequentially forming the plurality of second electrodes, the plurality of semiconductor epitaxial structures, the plurality of first electrodes, and the plurality of spherical extension electrodes on a substrate, and removing the plurality of second electrodes, the plurality of semiconductor epitaxial structures, the plurality of first electrodes, and the plurality of spherical extension electrodes from the substrate, to form the plurality of light emitting devices.

12. The manufacturing method as claimed in claim 7, wherein bonding the plurality of spherical extension electrodes of the plurality of light emitting devices to the plurality of pads further includes:
   performing a reflow process.

13. The manufacturing method as claimed in claim 7, wherein forming a common electrode electrically connected to the plurality of second electrodes further includes a wired bonding of the plurality of second electrodes by a single wire.

* * * * *